(12) United States Patent
Takaya et al.

(10) Patent No.: US 8,823,472 B2
(45) Date of Patent: Sep. 2, 2014

(54) ELECTROMAGNETIC CONTACTOR

(75) Inventors: Kouetsu Takaya, Kounosu (JP); Yasuhiro Naka, Kounosu (JP); Kenji Suzuki, Kounosu (JP); Yuichi Yamamoto, Kounosu (JP); Yuji Shiba, Kounosu (JP)

(73) Assignees: Fuji Electric Co., Ltd., Kawasaki-shi (JP); Fuji Electric FA Components & Systems Co., Ltd., Tokyo (JP)

( * ) Notice: Subject to any disclaimer, the term of this patent is extended or adjusted under 35 U.S.C. 154(b) by 0 days.

(21) Appl. No.: 13/885,094

(22) PCT Filed: Apr. 3, 2012

(86) PCT No.: PCT/JP2012/002330
§ 371 (c)(1),
(2), (4) Date: Jun. 6, 2013

(87) PCT Pub. No.: WO2012/157173
PCT Pub. Date: Nov. 22, 2012

(65) Prior Publication Data
US 2013/0257567 A1    Oct. 3, 2013

(30) Foreign Application Priority Data

May 19, 2011    (JP) .................................. 2011-112912

(51) Int. Cl.
| | |
|---|---|
| *H01H 63/02* | (2006.01) |
| *H01H 51/06* | (2006.01) |
| *H03K 17/68* | (2006.01) |
| *H01H 50/16* | (2006.01) |
| *H01H 50/38* | (2006.01) |
| *H01H 9/44* | (2006.01) |
| *H01H 1/06* | (2006.01) |
| *H01H 50/14* | (2006.01) |

(52) U.S. Cl.
CPC ................ *H01H 1/06* (2013.01); *H01H 51/065* (2013.01); *H03K 17/68* (2013.01); *H01H 50/163* (2013.01); *H01H 50/38* (2013.01); *H01H 9/443* (2013.01); *H01H 50/14* (2013.01)
USPC .......................................... 335/133; 335/132

(58) Field of Classification Search
USPC ......................................................... 335/133
See application file for complete search history.

(56) References Cited

U.S. PATENT DOCUMENTS

| | | | | |
|---|---|---|---|---|
| 6,768,405 | B2 * | 7/2004 | Nishida et al. | 335/177 |
| 6,897,750 | B2 * | 5/2005 | Neuberth | 335/296 |

(Continued)

FOREIGN PATENT DOCUMENTS

| | | |
|---|---|---|
| JP | 3107288 B | 9/2000 |
| JP | 2005-183286 A | 7/2005 |

(Continued)

*Primary Examiner* — Shawki S Ismail
*Assistant Examiner* — Lisa Homza
(74) *Attorney, Agent, or Firm* — Manabu Kanesaka

(57) ABSTRACT

An electromagnetic contactor has a contact device having a pair of fixed contacts and a movable contact; and an electromagnet unit including an exciting coil driving a movable plunger connected through a connecting shaft. The contact device is configured such that L-shaped portions have a contact portion formed in the pair of fixed contacts fixed maintaining a predetermined interval, and two ends of the movable contact are disposed to be capable of contacting to and separating from the contact portions of the L-shaped portion on a side opposite to that of the electromagnet unit. The electromagnet unit includes a magnetic yoke enclosing a plunger drive portion, a movable plunger having a leading end protruding through an aperture formed in the magnetic yoke and urged by a return spring, and a ring-form permanent magnet magnetized in a movable direction of the movable plunger and fixed to enclose a peripheral flange portion.

8 Claims, 15 Drawing Sheets

(56) References Cited

U.S. PATENT DOCUMENTS

| | | | |
|---|---|---|---|
| 6,975,194 B2* | 12/2005 | Nishida et al. | 335/132 |
| 7,145,422 B2* | 12/2006 | Imanishi et al. | 335/201 |
| 7,157,995 B2* | 1/2007 | Nishida et al. | 335/126 |
| 7,286,031 B2* | 10/2007 | Nishida et al. | 335/132 |
| 7,852,178 B2* | 12/2010 | Bush et al. | 335/126 |
| 7,859,373 B2* | 12/2010 | Yamamoto et al. | 335/126 |
| 7,911,301 B2* | 3/2011 | Yano et al. | 335/131 |
| 7,948,338 B2* | 5/2011 | Niimi et al. | 335/126 |
| 8,138,440 B2* | 3/2012 | Onufriyenko et al. | 218/154 |
| 8,138,863 B2* | 3/2012 | Tanaka et al. | 335/195 |
| 8,138,872 B2* | 3/2012 | Yoshihara et al. | 335/281 |
| 8,179,217 B2* | 5/2012 | Kawaguchi et al. | 335/80 |
| 8,188,818 B2* | 5/2012 | Cho et al. | 335/126 |
| 8,222,980 B2* | 7/2012 | Yamagata et al. | 335/126 |
| 8,390,410 B2* | 3/2013 | Kojima et al. | 335/201 |
| 8,410,878 B1* | 4/2013 | Takaya et al. | 335/201 |
| 2004/0080389 A1* | 4/2004 | Nishida et al. | 335/132 |
| 2005/0146405 A1* | 7/2005 | Nishida et al. | 335/132 |
| 2005/0151606 A1 | 7/2005 | Nishida et al. | |
| 2009/0284335 A1* | 11/2009 | Kim et al. | 335/201 |
| 2009/0322453 A1 | 12/2009 | Kawaguchi et al. | |
| 2009/0322455 A1* | 12/2009 | Yoshihara et al. | 335/189 |

FOREIGN PATENT DOCUMENTS

| | | |
|---|---|---|
| JP | 2006-261056 A | 9/2006 |
| JP | 2010-010058 A | 1/2010 |

\* cited by examiner

ELECTROMAGNETIC CONTACTOR

RELATED APPLICATION

The present application is National Phase of International Application No. PCT/JP2012/0023330 filed Apr. 3, 2012, and claims priority from Japanese Application No. 2011-112912, filed May 19, 2011.

TECHNICAL FIELD

The present invention relates to an electromagnetic contactor, including a contact device that includes fixed contacts and a movable contact and an electromagnet unit that drives the movable contact, interposed in a current path.

BACKGROUND ART

An electromagnetic contactor that carries out switching of a current path is such that a movable contact is driven by an exciting coil and movable plunger of an electromagnet unit. That is, when the exciting coil is in a non-excited state, the movable plunger is urged by a return spring, and the movable contact is in a released condition wherein it is distanced from a pair of fixed contacts disposed maintaining a predetermined interval. From the released condition, the movable plunger can be moved against the return spring by exciting the exciting coil, and the movable contact takes on an engaged condition wherein it contacts with the pair of fixed contacts (for example, refer to PLT 1).

CITATION LIST

Patent Literature

PLT 1: Japanese Patent No. 3,107,288

SUMMARY OF INVENTION

Technical Problem

However, the heretofore known example described in PLT 1 is such that, when shifting from the engaged condition to the released condition, an arc is generated between the fixed contacts and the movable contact. When switching a current path along which a large current in the region of a few tens to a few hundred amps flows; it is necessary to increase the distance between the fixed contacts and movable contact in the released condition in order to reliably extinguish the arc, and necessary to increase the urging force of the return spring for switching from the engaged condition to the released condition, meaning that there is an unsolved problem in that there is an increase in size of the configuration of the whole electromagnetic contactor.

Therefore, the invention, having been conceived focusing on the unsolved problem of the heretofore known example, has an object of providing an electromagnetic contactor such that it is possible to reduce the size of the overall configuration, even when switching a large current.

Solution to Problem

In order to achieve the object, an electromagnetic contactor according to one aspect of the invention includes a contact device comprising a pair of fixed contacts and a movable contact disposed so as to be capable of contacting to and separating from the pair of fixed contacts and an electromagnet unit including an exciting coil that drives a movable plunger connected via a connecting shaft to the movable contact of the contact device. The contact device has a configuration such that L-shaped portions having contact portions and extending to a predetermined length in mutually facing directions are formed in the pair of fixed contacts fixed maintaining a predetermined interval, and two ends of the movable contact are disposed so as to be capable of contacting to and separating from the contact portions of the L-shaped portion on the side opposite to that of the electromagnet unit. The electromagnet unit includes a magnetic yoke enclosing a plunger drive portion, a movable plunger whose leading end protrudes through an aperture formed in the magnetic yoke and urged by a return spring, and a ring-form permanent magnet, magnetized in the movable direction of the movable plunger, disposed and fixed so as to enclose a peripheral flange portion formed on the protruding end side of the movable plunger.

According to this configuration, by forming the L-shaped portions having a contact portion and extending to a predetermined length in the mutually facing directions in the pair of fixed contacts configuring the contact device, and disposing the movable contact so that the two ends thereof are disposed so as to be capable of contacting to and separating from the contact portions of the pair of fixed contacts on the side opposite to that of the electromagnet unit, it is possible to reduce the height of the contact device in the movable direction of the movable contact.

Also, by providing the permanent magnet so as to enclose the peripheral flange portion of the movable plunger in the electromagnet unit, and by providing the auxiliary yoke, it is possible to cause attracting force to act on the movable plunger so as to move the movable contact in a releasing direction, thus suppressing the urging force of the return spring. Because of this, it is possible to reduce the magnetomotive force of the exciting coil, thus reducing the size of the electromagnet unit. Also, it is possible to attract the peripheral flange portion of the movable plunger with the magnetic force of the permanent magnet in the released condition, and thus possible to secure high anti-malfunction performance when releasing. As it is possible to reduce the urging force of the return spring, it is possible to further reduce the height of the electromagnet unit.

Also, it is preferable that the electromagnetic contactor is such that the pair of fixed contacts is such that the L-shaped portion is modified to a C-shaped portion by forming opposing plate portions in positions such as to face each other from either side of the two ends of the movable contact, and an insulating cover that regulates arc generation is mounted on inner peripheral portions of the C-shaped portion other than the contact portion.

According to this configuration, it is possible in the engaged condition wherein the movable contact is in contact with the pair of fixed contacts to generate a large Lorentz force that acts against the electromagnetic repulsion force working in accordance with the conducted current in a direction such as to open the contacts. Also, due to the two end portions of the movable contact being disposed inside the C-shaped portion, an arc is also generated in a portion other than between the contact portions when shifting from the engaged condition to the released condition, but it is possible to suppress the generation of the arc in a portion other than between the contact portions with the insulating cover.

Also, it is preferable that the electromagnetic contactor is such that the contact device has a configuration such that the pair of fixed contacts and the movable contact are enclosed in a contact housing case, and an arc extinguishing permanent magnet is disposed along the movable contact on the inner peripheral surface side of the contact housing case.

According to this configuration, as the arc extinguishing permanent magnet is disposed on the inner side of the insulating case, it is possible to bring the arc extinguishing permanent magnet near the portion between the pair of fixed contacts and the movable contact in which the arc is generated. Also, it is possible to form a large arc extinguishing space on the outer side of the arc extinguishing permanent magnet in a direction facing the pair of fixed contacts, and thus possible to reliably carry out the extinguishing of the arc.

Also, it is preferable that the electromagnetic contactor is such that the contact housing case is configured to have a metal tubular body, one end of which is hermetically sealed to an upper magnetic yoke of the electromagnet unit, enclosing the pair of fixed contacts and the movable contact, a fixed contact support insulating substrate joined hermetically closing off an open end plane of the metal tubular body and supporting the pair of fixed contacts, and an insulating tubular body disposed on the inner peripheral surface of the metal tubular body.

According to this configuration, it is possible to easily carry out the fixing of the pair of fixed contacts having the L-shaped portion or C-shaped portion to the insulating case having air tightness.

Also, it is preferable that the electromagnetic contactor is such that the movable contact is disposed so as to be movable via a contact spring in the flange portion formed on the leading end of the connecting shaft connected to the movable plunger, and a central portion supported by the connecting shaft and receiving the contact spring is a depressed portion protruding on the electromagnet unit side.

According to this configuration, it is possible to lower the position in which the contact spring is disposed by an amount equivalent to the depressed portion formed in the movable contact, and thus possible to lower the height of the contact device in the movable direction of the movable contact.

Also, the electromagnetic contactor may be made such that the electromagnet unit includes a magnetic yoke having a cross-section in a U-shape whose upper portion is open, an upper magnetic yoke bridging the upper open portion of the magnetic yoke, a spool disposed on a bottom surface plate portion of the magnetic yoke and having a central aperture in which an exciting coil is wound, a movable plunger movably disposed in the central aperture of the spool in an axial direction, and having the leading end protruding through the aperture formed in the upper magnetic yoke, the plunger urged by a return spring, a ring-form permanent magnet fixed on the upper magnetic yoke to enclose a peripheral flange portion formed on the leading end side of the movable plunger, and magnetized in an axial direction, and an auxiliary yoke fixed on the upper surface of the ring-form permanent magnet and in contact with the peripheral flange portion of the movable plunger on the side opposite to that of the upper magnetic yoke.

According to this configuration, in a condition in which the peripheral flange portion of the movable plunger is in contact with the auxiliary yoke, it is possible to form a magnetic path that passes through the ring-form permanent magnet, auxiliary yoke, movable plunger, U-shaped magnetic yoke, and upper magnetic yoke, and returns to the ring-form permanent magnet. Also, when the exciting coil wound in the spool is excited, a magnetic path is formed such that magnetic flux generated by the exciting coil passes through the movable plunger, upper magnetic yoke, and U-shaped magnetic yoke, so that it is possible to cause the movable plunger to move against the return spring.

Also, it is preferable that the electromagnetic contactor is made such that the electromagnet unit includes a ring-form auxiliary yoke that encloses side surfaces of a bottom surface side end portion of the U-shaped magnetic yoke of the movable plunger in a released position, wherein the length of a gap between the ring-form auxiliary yoke and the side surface of the movable plunger is set to be less than the length of a gap between the bottom surface side end portion of the movable plunger and the U-shaped magnetic yoke.

According to this configuration, it is possible to reliably form a magnetic path for magnetic flux generated when the exciting coil is excited in a released position condition, increasing the magnetic flux density between the flange of the movable plunger and the upper magnetic yoke, and thus improving the attracting force of the movable plunger.

Advantageous Effects of Invention

According to the invention, an advantage is obtained in that it is possible to lower the height of the contact device in the movable direction of the movable contact, possible to reduce the size of the electromagnet unit, and thus possible to reduce the size of the configuration of the whole electromagnetic contactor.

Also, as the arc extinguishing permanent magnet is disposed on the inner peripheral surface side along the movable contact in the contact housing case, an advantage is obtained in that there is generated a magnetic flux that crosses an arc generated in the contact portions of the pair of fixed contacts and movable contact when shifting from the engaged condition to the released condition, thus extending the arc, a large arc extinguishing space can be formed on the outer side of the permanent magnet in a direction facing the pair of fixed contacts, the necessary arc length is secured, and it is thus possible to reliably carry out the extinguishing of the arc.

Also, as the permanent magnet that attracts the movable plunger in the releasing direction is disposed in the electromagnet unit, the movable plunger is attracted by the permanent magnet when releasing, and it is possible to reliably prevent the movable contact from making unwanted contact with the pair of fixed contacts due to vibration, shock, or the like. Simultaneously with this, it is possible to reduce the urging force of the return spring by the amount by which the movable plunger is attracted by the permanent magnet, and thus possible to reduce the magnetomotive force of the exciting coil, and reduce the size of the electromagnet unit.

BRIEF DESCRIPTION OF DRAWINGS

FIGS. 3(a)-3(c) show diagrams showing an insulating cover of a contact device, wherein FIG. 3(a) is a perspective view, FIG. 3(b) is a plan view before mounting, and FIG. 3(c) is a plan view after mounting.

FIGS. 9(a), 9(b) show diagrams illustrating an action of attracting the movable plunger with the permanent magnet, wherein FIG. 9(a) is a partial sectional view showing a released condition and FIG. 9(b) is a partial sectional view showing an engaged condition.

FIGS. 11(a), 11(b) show diagrams showing a modification example of the contact device of the invention, wherein FIG. 11(a) is a sectional view and FIG. 11(b) is a perspective view.

FIGS. 12(a), 12(b) show diagrams showing another modification example of the contact device of the invention, wherein FIG. 12(a) is a sectional view and FIG. 12(b) is a perspective view.

FIGS. 14(a), 14(b) show diagrams showing a modification example of a cylindrical auxiliary yoke of an electromagnet unit, wherein FIG. 14(a) is a sectional view and FIG. 14(b) is an exploded perspective view.

FIGS. 15(a), 15(b) show diagrams showing a modification example of the cylindrical auxiliary yoke of the electromagnet unit, wherein FIG. 15(a) is a sectional view and FIG. 15(b) is an exploded perspective view.

DESCRIPTION OF EMBODIMENTS

Hereafter, a description will be given, based on the drawings, of embodiments of the invention.

Figure 1:
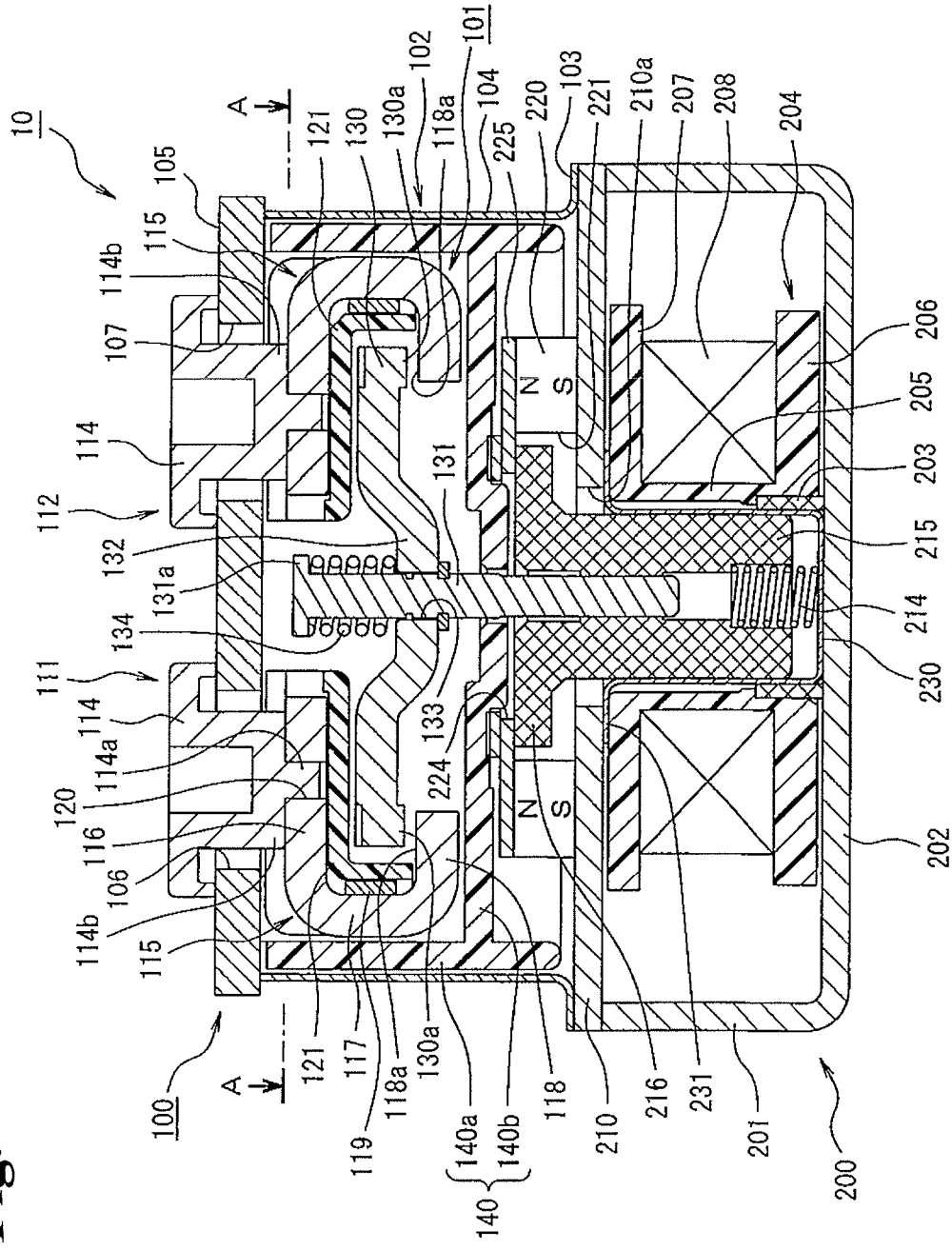
FIG. 1 is a sectional view showing a first embodiment of an electromagnetic contactor according to the invention.
Figure 2A:
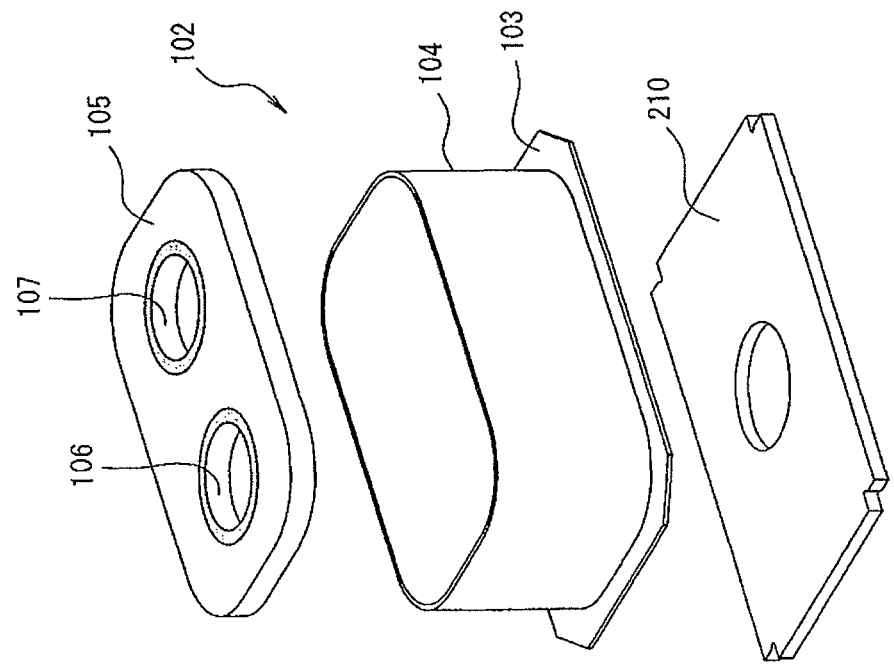
FIGS. 2(a), 2(b) are exploded perspective views of an arc extinguishing chamber.
Figure 2B:
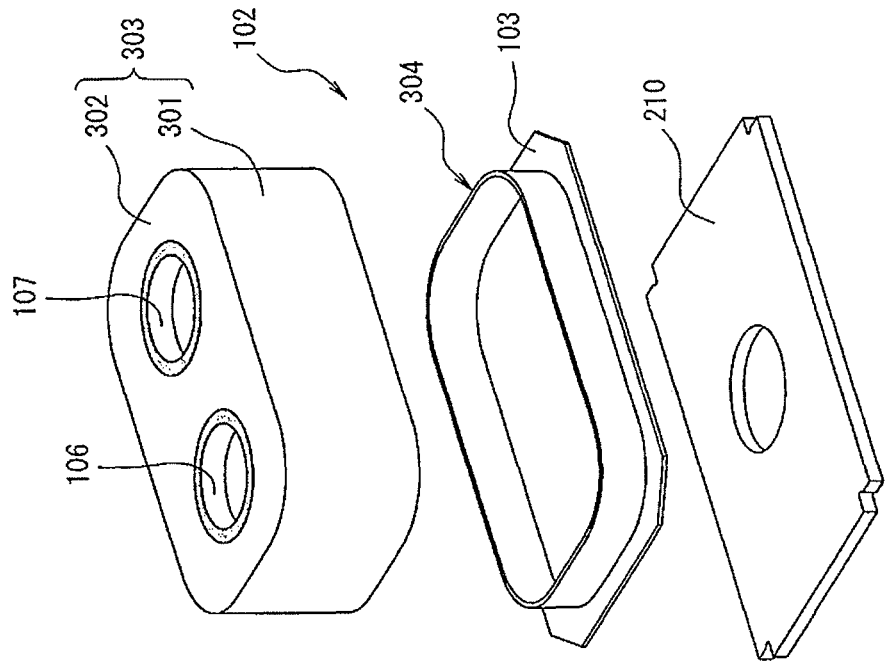

FIG. 1 is a sectional view showing one example of an electromagnetic contactor according to the invention, while FIGS. 2(a), 2(b) are exploded perspective views of an arc extinguishing chamber. In FIG. 1 and FIGS. 2(a), 2(b), numeral is an electromagnetic contactor, and the electromagnetic contactor 10 is configured of a contact device 100 in which is disposed a contact mechanism, and an electromagnet unit 200 that drives the contact device 100.

The contact device 100 has an arc extinguishing chamber 102 in which is housed a contact mechanism 101, as is clear from FIG. 1 and FIGS. 2(a), 2(b). The arc extinguishing chamber 102, as shown in FIG. 2(a), includes a metal square tubular body 104 having on a lower end portion a metal flange portion 103 protruding outward, and a fixed contact support insulating substrate 105 configured of a plate-like ceramic insulating substrate that closes off the upper end of the metal square tubular body 104.

The metal square tubular body 104 is such that the flange portion 103 thereof is seal joined to an upper portion magnetic yoke 210 of the electromagnet unit 200, to be described hereafter.

Also, through holes 106 and 107 into which are inserted a pair of fixed contacts 111 and 112, to be described hereafter, are formed maintaining a predetermined interval in a central portion of the fixed contact support insulating substrate 105. A metalizing process is performed around the through holes 106 and 107 on the upper surface side of the fixed contact support insulating substrate 105, and in a position on the lower surface side that contacts with the square tubular body 104. To carry out the metalizing process, in a condition in which a plurality of fixed contact support insulating substrates 105 is arranged vertically and horizontally on a flat surface, a metal foil is formed around the through holes 106 and 107 and in a position that contacts with the square tubular body 104.

The contact mechanism 101, as shown in FIG. 1, includes the pair of fixed contacts 111 and 112 inserted into and fixed in the through holes 106 and 107 of the fixed contact support insulating substrate 105 of the arc extinguishing chamber 102. Each of the fixed contacts 111 and 112 includes a support conductor portion 114, having on an upper end a flange portion protruding outward, inserted into the through holes 106 and 107 of the fixed contact support insulating substrate 105, and a C-shaped portion 115, the inner side of which is open, linked to the support conductor portion 114 and disposed on the lower surface side of the fixed contact support insulating substrate 105.

The C-shaped portion 115 is formed in a C-shape of an upper plate portion 116 extending to the outer side along the lower surface of the fixed contact support insulating substrate 105, an intermediate plate portion 117 extending downward from the outer side end portion of the upper plate portion 116, and a lower plate portion 118 extending from the lower end side of the intermediate plate portion 117, parallel with the upper plate portion 116, to the inner side, that is, in a direction facing the fixed contacts 111 and 112, wherein the upper plate portion 116 is added to an L-shape formed by the intermediate plate portion 117 and lower plate portion 118.

Herein, the support conductor portion 114 and C-shaped portion 115 are fixed by, for example, brazing in a condition in which a pin 114a formed protruding on the lower end surface of the support conductor portion 114 is inserted into a through hole 120 formed in the upper plate portion 116 of the C-shaped portion 115. The fixing of the support conductor portion 114 and C-shaped portion 115, not being limited to brazing, may be such that the pin 114a is fitted into the through hole 120, or an external thread is formed on the pin 114a and an internal thread is formed in the through hole 120, and the two are screwed together.

Also, a magnetic plate 119 of a C-shape when seen in plan view is mounted so as to cover the inner side surface of the intermediate plate portion 117 in the C-shaped portion 115 of the fixed contacts 111 and 112. By disposing the magnetic plate 119 so as to cover the inner side surface of the intermediate plate portion 117 in this way, it is possible to shield a magnetic field generated by current flowing through the intermediate plate portion 117. Because of this, in the event that an arc is generated when, from a condition in which contact portions 130a of a movable contact 130 are contacting with contact portions 118a of the fixed contacts 111 and 112, the contact portions 130a move away upward, as described hereafter, it is possible to prevent interference between a magnetic field caused by the current flowing through the intermediate plate portion 117 and a magnetic field caused by the arc generated between the contact portions 118a of the fixed contacts 111 and 112 and the contact portions 130a of the movable contact 130. Consequently, it is possible to prevent the two magnetic fields from repelling each other, the arc being moved to the inner side along the movable contact 130 by this electromagnetic repulsion, and interruption of the arc becoming difficult.

Figure 3A:
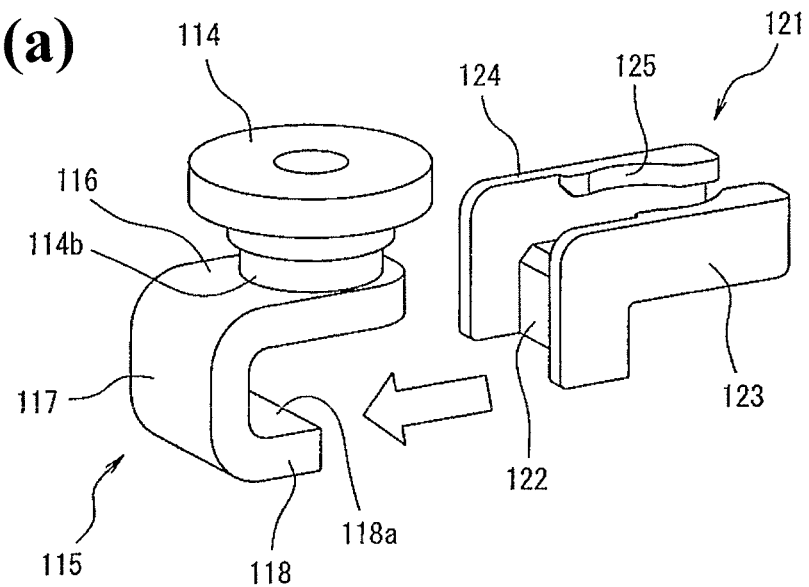
Figure 3B:
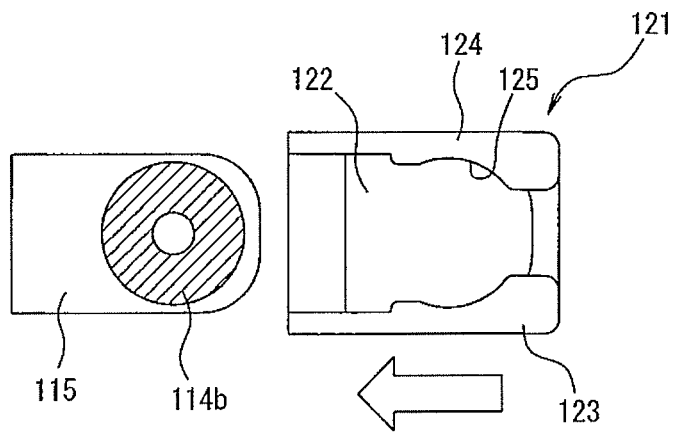

Furthermore, an insulating cover 121 made of a synthetic resin material, which regulates arc generation, is mounted on the C-shaped portion 115 of each of the fixed contacts 111 and 112. The insulating cover 121 covers the inner peripheral surfaces of the upper plate portion 116 and intermediate plate portion 117 of the C-shaped portion 115, as shown in FIGS. 3(a), 3(b). The insulating cover 121 includes an L-shaped plate portion 122 that follows the inner peripheral surfaces of the upper plate portion 116 and intermediate plate portion 117, side plate portions 123 and 124, each extending upward and outward from front and rear end portions of the L-shaped plate portion 122, that cover side surfaces of the upper plate portion 116 and intermediate plate portion 117 of the C-shaped portion 115, and a fitting portion 125, formed on the inward side from the upper end of the side plate portions 123 and 124, that fits onto a small diameter portion 114b formed on the support conductor portion 114 of the fixed contacts 111 and 112.

Figure 3C:
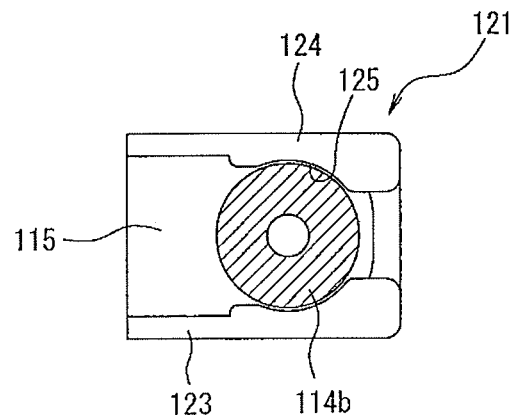

Consequently, the insulating cover 121 is placed in a condition in which the fitting portion 125 is facing the small diameter portion 114b of the support conductor portion 114 of the fixed contacts 111 and 112, as shown in FIGS. 3(a), 3(b), after which, as shown in FIG. 3(c), the fitting portion 125 is fitted into the small diameter portion 114b of the support conductor portion 114 by pushing the insulating cover 121.

Figure 4A:
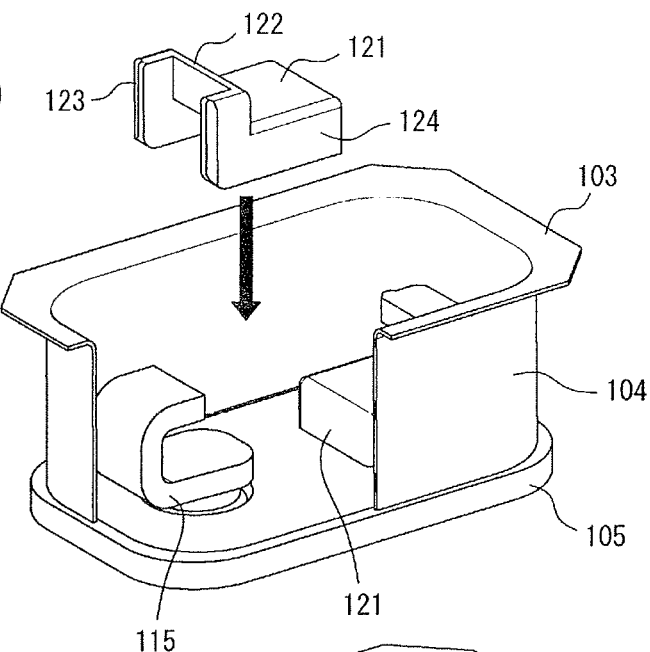
FIGS. 4(a)-4(c) are illustrations showing an insulating cover mounting method.

Actually, with the arc extinguishing chamber 102 after the fixed contacts 111 and 112 have been attached in a condition wherein the fixed contact support insulating substrate 105 is on the lower side, the insulating cover 121 is inserted from an upper aperture portion between the fixed contacts 111 and 112 in a condition vertically reverse of that in FIGS. 3(a), 3(c), as shown in FIG. 4(a).

Figure 4B:
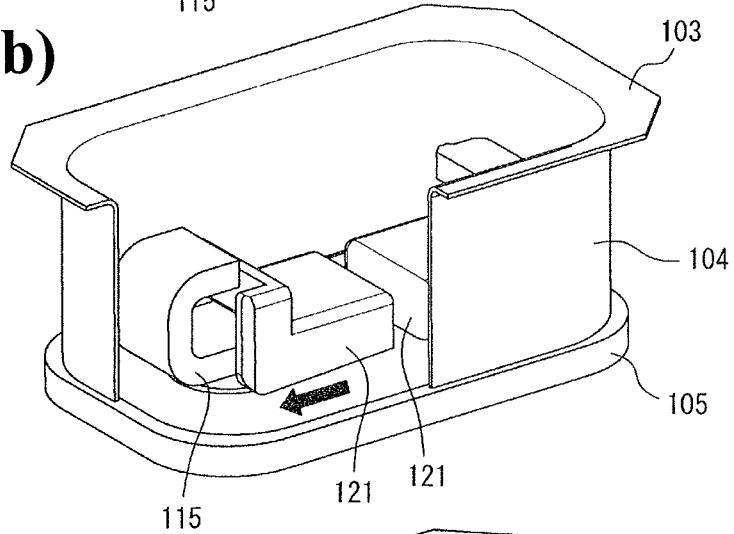
Figure 4C:
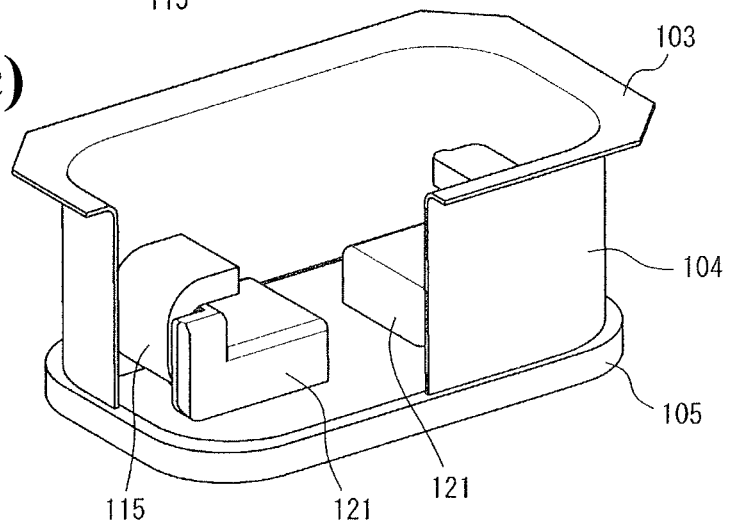

Next, in a condition in which the fitting portion 125 is in contact with the fixed contact support insulating substrate 105, as shown in FIG. 4(b), the fitting portion 125 is engaged with and fixed to the small diameter portion 114b of the support conductor portion 114 of the fixed contacts 111 and 112 by pushing the insulating cover 121 to the outer side, as shown in FIG. 4(c).

By mounting the insulating cover 121 on the C-shaped portion 115 of the fixed contacts 111 and 112 in this way, only the upper surface side of the lower plate portion 118 of the inner peripheral surface of the C-shaped portion 115 is exposed, and is taken to be the contact portion 118a.

Further, the movable contact 130 is disposed in such a way that both end portions are disposed in the C-shaped portion 115 of the fixed contacts 111 and 112. The movable contact 130 is supported by a connecting shaft 131 fixed to a movable plunger 215 of the electromagnet unit 200, to be described hereafter. The movable contact 130 is such that, as shown in FIG. 1, a central portion in the vicinity of the connecting shaft 131 protrudes downward, whereby a depressed portion 132 is formed, and a through hole 133 into which the connecting shaft 131 is inserted is formed in the depressed portion 132.

A flange portion 131a protruding outward is formed on the upper end of the connecting shaft 131. The connecting shaft 131 is inserted from the lower end side into a contact spring 134, then inserted into the through hole 133 of the movable contact 130, bringing the upper end of the contact spring 134 into contact with the flange portion 131a, and the moving contact 130 is positioned using, for example, a C-ring 135 so as to obtain a predetermined urging force from the contact spring 134.

The movable contact 130, in a released condition, takes on a condition wherein the contact portions 130a at either end and the contact portions 118a of the lower plate portions 118 of the C-shaped portions 115 of the fixed contacts 111 and 112 are separated from each other and maintaining a predetermined interval. Also, the movable contact 130 is set so that, in an engaged position, the contact portions at either end contact with the contact portions 118a of the lower plate portions 118 of the C-shaped portions 115 of the fixed contacts 111 and 112 at a predetermined contact pressure due to the contact spring 134.

Figure 5:
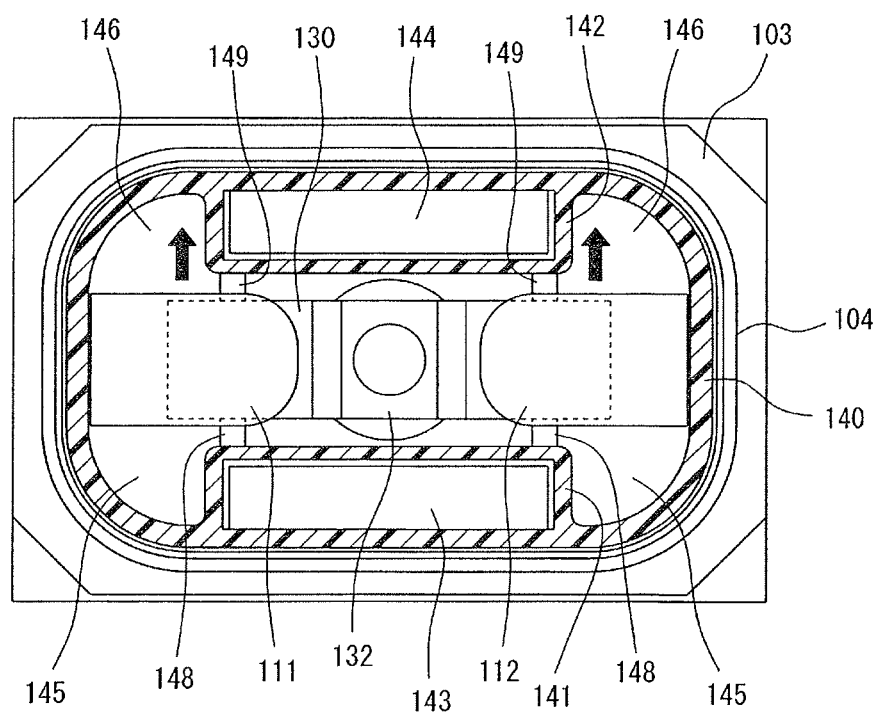
FIG. 5 is a sectional view along a line A-A in FIG. 1.

Furthermore, an insulating cylinder 140 made of, for example, a synthetic resin is disposed on the inner peripheral surface of the square tubular body 104 of the arc extinguishing cylinder 102. The insulating cylinder 140 is configured of a square tubular portion 140a disposed on the inner peripheral surface of the square tubular body 104 and a bottom plate portion 140b that closes off the lower surface side of the square tubular portion 140a. Magnet housing pockets 141 and 142 are formed on the inner peripheral surface of the square tubular body 140a of the insulating cylinder 140 facing the side surface of the movable contact 130, as shown in FIG. 5. Arc extinguishing permanent magnets 143 and 144 are inserted into and fixed in the magnet housing pockets 141 and 142.

The arc extinguishing permanent magnets 143 and 144 are magnetized in a thickness direction so that mutually opposing faces thereof are homopolar, for example, N-poles. Also, the arc extinguishing permanent magnets 143 and 144 are set so that both end portions in a left-right direction are slightly inward of positions in which the contact portions 118a of the fixed contacts 111 and 112 and the contact portions of the movable contact 130 are facing each other, as shown in FIG. 5. Further, arc extinguishing spaces 145 and 146 are formed on the outer sides in a left-right direction of the magnet housing pockets 141 and 142 respectively.

Also, movable contact guide members 148 and 149, which regulate the turning of the movable contact 130, are formed protruding, sliding against side edges of the magnet housing pockets 141 and 142 toward either end of the movable contact 130.

Figure 6A:
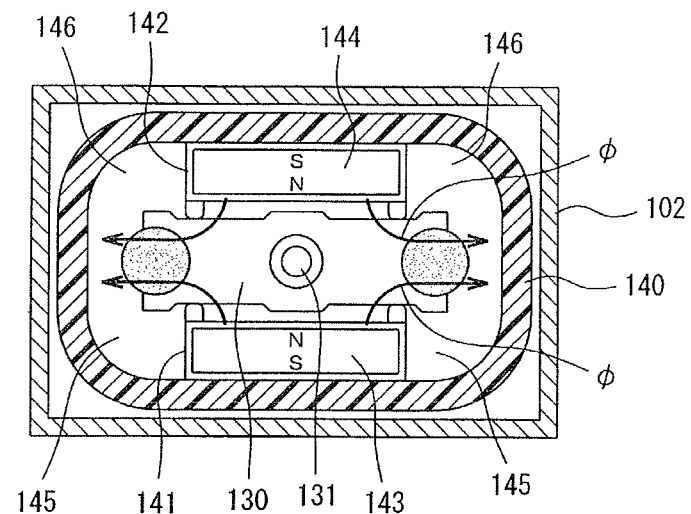
FIGS. 6(a)-6(c) are illustrations accompanying a description of arc extinguishing by an arc extinguishing permanent magnet according to the invention.

By disposing the arc extinguishing permanent magnets 143 and 144 on the inner peripheral surface side of the insulating cylinder 140 in this way, it is possible to bring the arc extinguishing permanent magnets 143 and 144 near the movable contact 130. Because of this, as shown in FIG. 6(a), magnetic flux φ emanating from the N-pole sides of the two arc extinguishing permanent magnets 143 and 144 crosses portions in which the contact portions 118a of the fixed contacts 111 and 112 and the contact portions 130a of the movable contact 130 are opposed in a left-right direction, from the inner side to the outer side, with a large magnetic flux density.

Figure 6B:
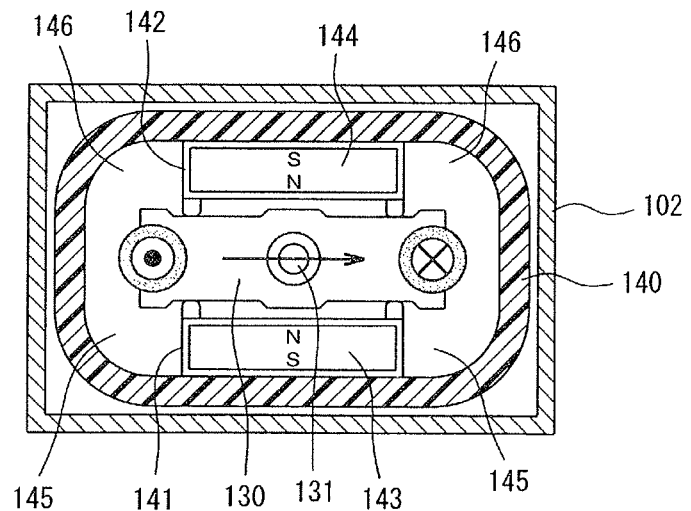

Consequently, assuming that the fixed contact 111 is connected to a current supply source and the fixed contact 112 is connected to a load side, the current direction in the engaged condition is such that the current flows from the fixed contact 111 through the movable contact 130 to the fixed contact 112, as shown in FIG. 6(b). Then, when changing from the engaged condition to the released condition by causing the movable contact 130 to move away upward from the fixed contacts 111 and 112, an arc is generated between the contact portions 118a of the fixed contacts 111 and 112 and the contact portions 130a of the movable contact 130.

The arc is extended to the arc extinguishing space 145 side on the arc extinguishing permanent magnet 143 side by the magnetic flux φ from the arc extinguishing permanent magnets 143 and 144. At this time, as the arc extinguishing spaces 145 and 146 are formed as widely as the thickness of the arc extinguishing permanent magnets 143 and 144, it is possible to obtain a long arc length, and thus possible to reliably extinguish the arc.

Figure 7A:
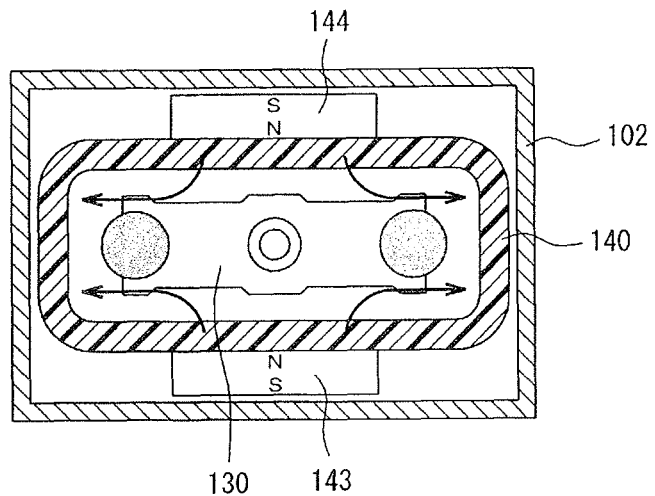
FIGS. 7(a)-7(c) are illustrations accompanying a description of arc extinction when the arc extinguishing permanent magnet is disposed on the outer side of an insulating case.
Figure 7B:
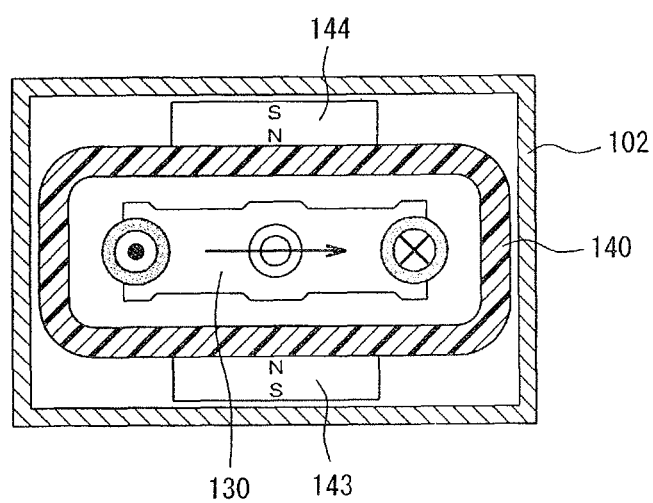
Figure 7C:
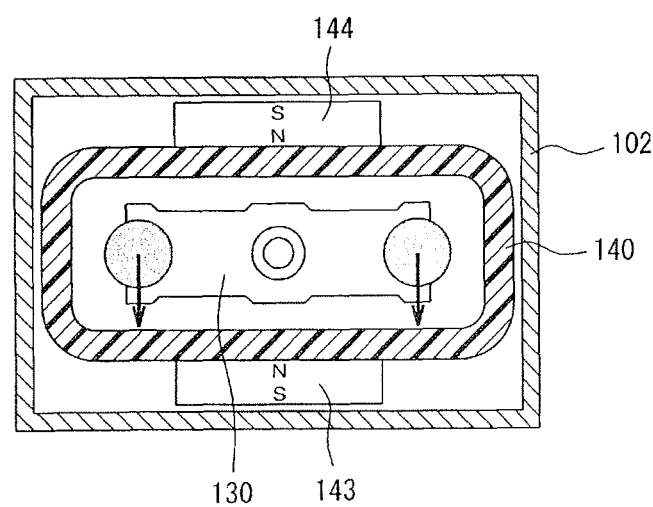

Incidentally, when the arc extinguishing permanent magnets 143 and 144 are disposed on the outer side of the insulating cylinder 140, as shown in FIGS. 7(a) to 7(c), there is an increase in the distance to the positions in which the contact portions 118a of the fixed contacts 111 and 112 and the contact portions 130a of the movable contact 130 are facing each other, and when the same permanent magnets as in this embodiment are applied, the density of the magnetic flux crossing the arc decreases.

Because of this, the Lorentz force acting on an arc generated when shifting from the engaged condition to the released condition decreases, and it is no longer possible to sufficiently extend the arc. In order to improve the arc extinguishing performance, it is necessary to increase the magnetization of the arc extinguishing permanent magnets 143 and 144. Moreover, in order to shorten the distance between the arc extinguishing permanent magnets 143 and 144 and the contact portions of the fixed contacts 111 and 112 and movable contact 130, it is necessary to reduce the depth in a front-back direction of the insulating cylinder 140, and there is a problem in that it is not possible to secure sufficient arc extinguishing space to extinguish the arc.

However, according to the heretofore described embodiment, the arc extinguishing permanent magnets 143 and 144 are disposed on the inner side of the insulating cylinder 140, meaning that the problems occurring when the arc extinguishing permanent magnets 143 and 144 are disposed on the outer side of the insulating cylinder 140 can all be solved.

The electromagnet unit 200, as shown in FIG. 1, has a magnetic yoke 201 of a flattened U-shape when seen from the side, and a cylindrical auxiliary yoke 203 is fixed in a central portion of a bottom plate portion 202 of the magnetic yoke 201. A spool 204 is disposed on the outer side of the cylindrical auxiliary yoke 203.

The spool 204 is configured of a central cylinder portion 205 in which the cylindrical auxiliary yoke 203 is inserted, a lower flange portion 206 protruding outward in a radial direction from a lower end portion of the central cylinder portion 205, and an upper flange portion 207 protruding outward in a radial direction from slightly below the upper end of the central cylinder portion 205. Further, an exciting coil 208 is mounted wound in a housing space configured of the central cylinder portion 205, lower flange portion 206, and upper flange portion 207.

Further, an upper magnetic yoke 210 is fixed between upper ends forming an open end of the magnetic yoke 201. A through hole 210a facing the central cylinder portion 205 of the spool 204 is formed in a central portion of the upper magnetic yoke 210.

Further, the movable plunger 215, in which is disposed a return spring 214 between a bottom portion and the bottom plate portion 202 of the magnetic yoke 201, is disposed in the central cylinder portion 205 of the spool 204 so as to be able to slide up and down. A peripheral flange portion 216 protruding outward in a radial direction is formed on the movable plunger 215, on an upper end portion protruding upward from the upper magnetic yoke 210.

Also, a permanent magnet 220 formed in a ring-form is fixed to the upper surface of the upper magnetic yoke 210 so as to enclose the peripheral flange portion 216 of the movable plunger 215. The permanent magnet 220 has a through hole 221 that encloses the peripheral flange portion 216. The permanent magnet 220 is magnetized in an up-down direction, that is, a thickness direction, so that, for example, the upper end side is an N-pole while the lower end side is an S-pole. Taking the form of the through hole 221 of the permanent magnet 220 to be a form shaped to the form of the peripheral flange portion 216, the form of the outer peripheral surface can be any form, such as a circle or a rectangle.

Further, an auxiliary yoke 225 of the same external form as the permanent magnet 220, and having a through hole 224 with an inner diameter smaller than the outer diameter of the peripheral flange portion 216 of the movable plunger 215, is fixed to the upper end surface of the permanent magnet 220. The peripheral flange portion 216 of the movable plunger 215 contacts with the lower surface of the auxiliary yoke 225.

Figure 8:
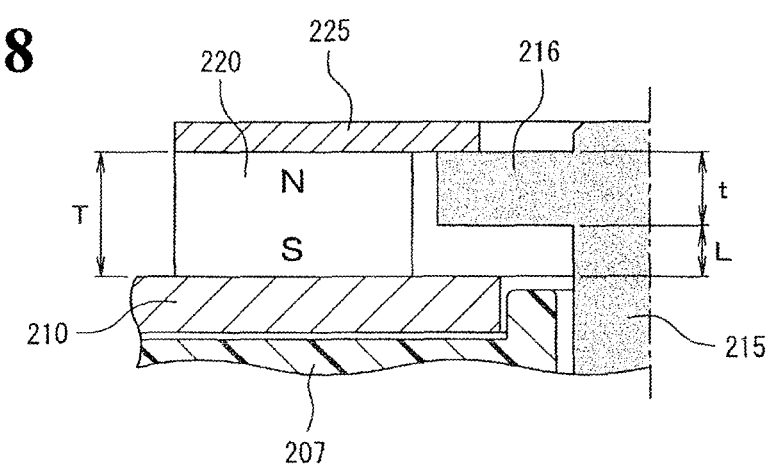
FIG. 8 is an enlarged sectional view showing the positional relationship between a permanent magnet and a movable plunger.

Herein, a thickness T of the permanent magnet 220 is set to a value (T=L+t) wherein a stroke L of the movable plunger 215 and a thickness t of the peripheral flange portion 216 of the movable plunger 215 are added together, as shown in FIG. 8. Consequently, the stroke L of the movable plunger 215 is regulated by the thickness T of the permanent magnet 220.

Because of this, it is possible to reduce to a minimum the cumulative number of parts and form tolerance, which affect the stroke of the movable plunger 215. Also, by determining the stroke L of the movable plunger 215 using only the thickness T of the permanent magnet 220 and the thickness t of the peripheral flange portion 216, it is possible to minimize variation of the stroke L. In particular, this is more advantageous in the case of a small electromagnetic contactor in which the stroke is small.

Also, as the permanent magnet 220 is formed in a ring-form, the number of parts decreases in comparison with a case in which two permanent magnets are disposed divided left and right, as described in, for example, PLT 2-91901, and a reduction in cost is achieved. Also, as the peripheral flange portion 216 of the movable plunger 215 is disposed in the vicinity of the inner peripheral surface of the through hole 221 formed in the permanent magnet 220, there is no waste in a closed circuit passing magnetic flux generated by the permanent magnet 220, leakage flux decreases, and it is possible to use the magnetic force of the permanent magnet effectively.

The form of the permanent magnet 220 not being limited to that heretofore described, it can also be formed in an annular form, or in other words, the external form can be any form provided that the inner peripheral surface is a cylindrical surface.

Also, the connecting shaft 131 that supports the movable contact 130 is screwed to the upper end surface of the movable plunger 215.

Further, in the released condition, the movable plunger 215 is urged upward by the return spring 214, and the upper surface of the peripheral flange. portion 216 attains a released position wherein it is brought into contact with the lower surface of the auxiliary yoke 225. In this condition, the contact portions 130a of the movable contact 130 have moved away upward from the contact portions 118a of the fixed contacts 111 and 112, causing a condition wherein current is interrupted.

In the released condition, the peripheral flange portion 216 of the movable plunger 215 is attracted to the auxiliary yoke 225 by the magnetic force of the permanent magnet 220, and by a combination of this and the urging force of the return spring 214, the condition in which the movable plunger 215 contacts with the auxiliary yoke 225 is maintained, with no unplanned downward movement due to external vibration, shock, or the like.

Figure 9A:
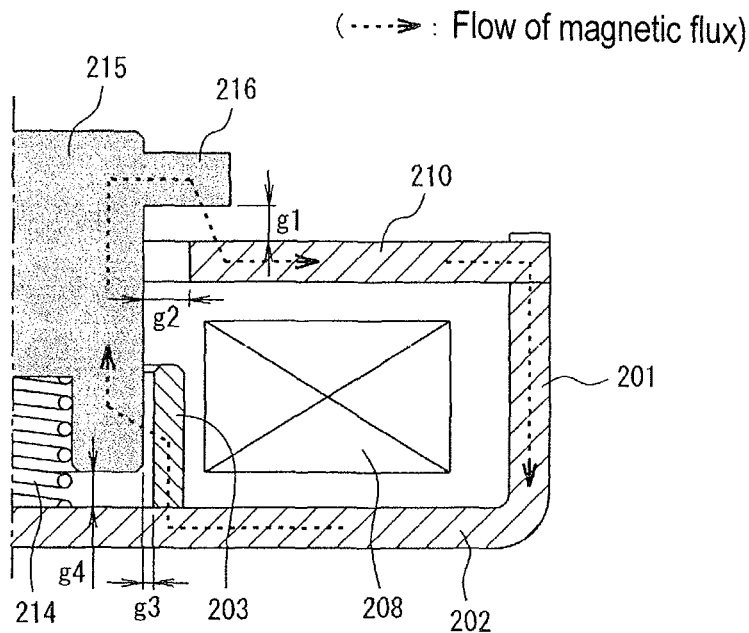

Also, in the released condition, as shown in FIG. 9(a), relationships between a gap g1 between the lower surface of the peripheral flange portion 216 of the movable plunger 215 and the upper surface of the upper magnetic yoke 210, a gap g2 between the outer peripheral surface of the movable plunger 215 and the through hole 210a of the upper magnetic yoke 210, a gap g3 between the outer peripheral surface of the movable plunger 215 and the cylindrical auxiliary yoke 203, and a gap g4 between the lower surface of the movable plunger 215 and the upper surface of the bottom plate portion 202 of the magnetic yoke 201 are set as below.

g1<g2 and g3<g4

Because of this, when exciting the exciting coil 208 in the released condition, the magnetic flux passes from the movable plunger 215 through the peripheral flange portion 216, passes through the gap g1 between the peripheral flange portion 216 and upper magnetic yoke 210, and reaches the upper magnetic yoke 210, as shown in FIG. 9(a). A closed magnetic circuit is formed from the upper magnetic yoke 210, through the U-shaped magnetic yoke 201 and through the cylindrical auxiliary yoke 203, as far as the movable plunger 215.

Because of this, it is possible to increase the magnetic flux density of the gap g1 between the lower surface of the peripheral flange portion 216 of the movable plunger 215 and the upper surface of the upper magnetic yoke 210, a larger attracting force is generated, and the movable plunger 215 is caused to descend against the urging force of the return spring 214 and the attracting force of the permanent magnet 220. Consequently, the contact portions 130a of the movable contact 130 connected to the movable plunger 215 via the connecting shaft 131 contact with the contact portions 118a of the fixed contacts 111 and 112, and a current path is formed from the fixed contact 111, through the movable contact 130, toward the fixed contact 112, creating the engaged condition.

Figure 9B:
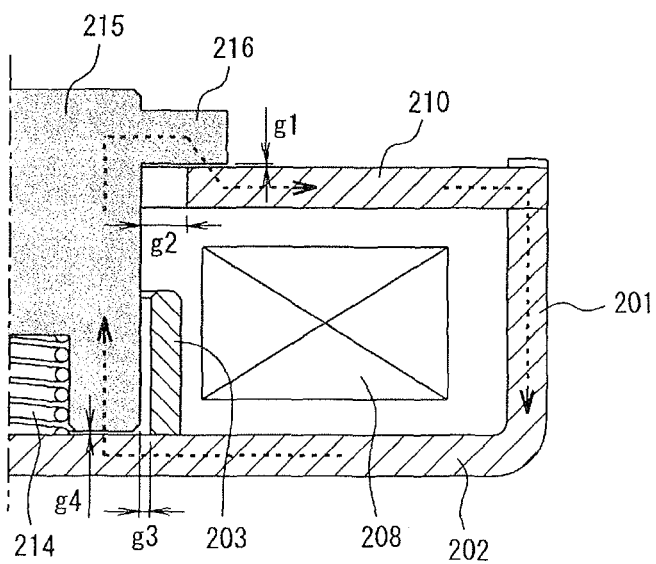

As the lower end surface of the movable plunger 215 nears the bottom plate portion 202 of the U-shaped magnetic yoke 201 on the engaged condition being created, as shown in FIG. 9(b), the heretofore described gaps g1 to g4 are as below.

g1<g2 and g3>g4

Because of this, the magnetic flux generated by the exciting coil 208 passes from the movable plunger 215 through the peripheral flange portion 216, and enters the upper magnetic yoke 210 directly, as shown in FIG. 9(b), while a closed magnetic circuit is formed from the upper magnetic yoke 210, through the U-shaped magnetic yoke 201, returning from the bottom plate portion 202 of the U-shaped magnetic yoke 201 directly to the movable plunger 215.

Because of this, a large attracting force acts in the gap g1 and gap g4, and the movable plunger 215 is held in the down position. Because of this, the condition wherein the contact portions 130a of the movable contact 130 connected to the movable plunger 215 via the connecting shaft 131 are in contact with the contact portions 118a of the fixed contacts 111 and 112 is continued.

Further, the movable plunger 215 is covered with a cap 230 formed in a bottomed tubular form made of a non-magnetic body, and a flange portion 231 formed extending outward in a radial direction on an open end of the cap 230 is seal joined to the lower surface of the upper magnetic yoke 210. By so doing, a hermetic receptacle, wherein the arc extinguishing chamber 102 and cap 230 are in communication via the through hole 210a of the upper magnetic yoke 210, is formed. Further, a gas such as hydrogen gas, nitrogen gas, a mixed gas of hydrogen and nitrogen, air, or $SF_6$ is encapsulated inside the hermetic receptacle formed by the arc extinguishing chamber 102 and cap 230.

Next, a description will be given of an operation of the heretofore described embodiment.

For now, it is assumed that the fixed contact 111 is connected to, for example, a power supply source that supplies a large current, while the fixed contact 112 is connected to a load.

In this condition, the exciting coil 208 in the electromagnet unit 200 is in a non-excited state, and there exists a released condition wherein no exciting force causing the movable plunger 215 to descend is being generated in the electromagnet unit 200. In this released condition, the movable plunger 215 is urged in an upward direction away from the upper magnetic yoke 210 by the return spring 214. Simultaneously with this, an attracting force caused by the magnetic force of the permanent magnet 220 acts on the auxiliary yoke 225, and the peripheral flange portion 216 of the movable plunger 215 is attracted. Because of this, the upper surface of the peripheral flange portion 216 of the movable plunger 215 contacts with the lower surface of the auxiliary yoke 225.

Because of this, the contact portions 130a of the movable contact 130 of the contact mechanism 101 connected to the movable plunger 215 via the connecting shaft 131 are separated by a predetermined distance upward from the contact portions 118a of the fixed contacts 111 and 112. Because of this, the current path between the fixed contacts 111 and 112 is in an interrupted condition, and the contact mechanism 101 is in a condition wherein the contacts are open.

In this way, as the urging force of the return spring 214 and the attracting force of the ring-form permanent magnet 220 both act on the movable plunger 215 in the released condition, there is no unplanned downward movement of the movable plunger 215 due to external vibration, shock, or the like, and it is thus possible to reliably prevent malfunction.

On the exciting coil 208 of the electromagnet unit 200 being excited in the released condition, an exciting force is generated in the electromagnet unit 200, and the movable plunger 215 is pressed downward against the urging force of the return spring 214 and the attracting force of the ring-form permanent magnet 220. At this time, as shown in FIG. 9(a), the gap g4 between the bottom surface of the movable plunger 215 and the bottom plate portion 202 of the magnetic yoke 201 is large, and hardly any magnetic flux passes through the gap g4.

However, the cylindrical auxiliary yoke 203 faces the lower outer peripheral surface of the movable plunger 215, and the gap g3 between the movable plunger 215 and the cylindrical auxiliary yoke 203 is set to be smaller in comparison with the gap g4. Because of this, a magnetic path passing through the cylindrical auxiliary yoke 203 is formed between the movable plunger 215 and the bottom plate portion 202 of the magnetic yoke 201.

Furthermore, the gap g1 between the lower surface of the peripheral flange portion 216 of the movable plunger 215 and the upper magnetic yoke 210 is set to be smaller in comparison with the gap g2 between the outer peripheral surface of the movable plunger 215 and the inner peripheral surface of the through hole 210a of the upper magnetic yoke 210. Because of this, the magnetic flux density between the lower surface of the peripheral flange portion 216 of the movable plunger 215 and the upper surface of the upper magnetic yoke 210 increases, and a large attracting force acts, attracting the peripheral flange portion 216 of the movable plunger 215.

Consequently, the movable plunger 215 descends swiftly against the urging force of the return spring 214 and the attracting force of the ring-form permanent magnet 220. Because of this, the descent of the movable plunger 215 is stopped by the lower surface of the peripheral flange portion 216 contacting with the upper surface of the upper magnetic yoke 210, as shown in FIG. 9(b).

By the movable plunger 215 descending in this way, the movable contact 130 connected to the movable plunger 215 via the connecting shaft 131 also descends, and the contact portions 130a of the movable contact 130 contact with the contact portions 118a of the fixed contacts 111 and 112 with the contact pressure of the contact spring 134.

Because of this, there exists a closed contact condition wherein the large current of the external power supply source is supplied via the fixed contact 111, movable contact 130, and fixed contact 112 to the load.

At this time, an electromagnetic repulsion force is generated between the fixed contacts 111 and 112 and the movable contact 130 in a direction such as to cause the contacts of the movable contact 130 to open.

However, as the fixed contacts 111 and 112 are such that the C-shaped portion 115 is formed of the upper plate portion 116, intermediate plate portion 117, and lower plate portion 118, as shown in FIG. 1, the current in the upper plate portion 116 and lower plate portion 118 and the current in the opposing movable contact 130 flow in opposite directions. Because of this, from the relationship between a magnetic field formed by the lower plate portions 118 of the fixed contacts 111 and 112 and the current flowing through the movable contact 130, it is possible, in accordance with Fleming's left-hand rule, to generate a Lorentz force that presses the movable contact 130 against the contact portions 118a of the fixed contacts 111 and 112.

Because of this Lorentz force, it is possible to oppose the electromagnetic repulsion force generated in the contact opening direction between the contact portions 118a of the fixed contacts 111 and 112 and the contact portions 130a of the movable contact 130, and thus possible to reliably prevent the contact portions 130a of the movable contact 130 from opening. Because of this, it is possible to reduce the pressing force of the contact spring 134 supporting the movable contact 130, and also possible to reduce thrust generated in the exciting coil 208 in response to the pressing force, and it is thus possible to reduce the size of the overall configuration of the electromagnetic contactor.

When interrupting the supply of current to the load in the closed contact condition of the contact mechanism 101, the exciting of the exciting coil 208 of the electromagnet unit 200 is stopped.

By so doing, the exciting force causing the movable plunger 215 to move downward in the electromagnet unit 200 stops, the movable plunger 215 is raised by the urging force of the return spring 214, and the attracting force of the ring-form permanent magnet 220 increases as the peripheral flange portion 216 nears the auxiliary yoke 225.

By the movable plunger 215 rising, the movable contact 130 connected via the connecting shaft 131 rises. As a result of this, the movable contact 130 is in contact with the fixed contacts 111 and 112 for as long as contact pressure is applied by the contact spring 134. Subsequently, there starts an open contact condition, wherein the movable contact 130 moves upward away from the fixed contacts 111 and 112 at the point at which the contact pressure of the contact spring 134 stops.

On the open contact condition starting, an arc is generated between the contact portions 118a of the fixed contacts 111 and 112 and the contact portions 130a of the movable contact 130, and the condition in which current is conducted is continued due to the arc. At this time, as the insulating cover 121 is mounted covering the upper plate portion 116 and intermediate plate portion 117 of the C-shaped portion 115 of the fixed contacts 111 and 112, it is possible to cause the arc to be generated only between the contact portions 118a of the fixed contacts 111 and 112 and the contact portions 130a of the movable contact 130. Because of this, it is possible to stabilize the arc generation condition, and thus possible to improve arc extinguishing performance.

Also, as the upper plate portion 116 and intermediate plate portion 117 of the C-shaped portion 115 are covered by the insulating cover 121, it is possible to maintain insulating distance with the insulating cover 121 between the two end portions of the movable contact 130 and the upper plate portion 116 and intermediate plate portion 117 of the C-shaped portion 115, and thus possible to reduce the height in the movable direction of the movable contact 130. Consequently, it is possible to reduce the size of the contact device 100.

Furthermore, as the inner surface of the intermediate plate portion 117 of the fixed contacts 111 and 112 is covered by the magnetic plate 119, a magnetic field generated by current flowing through the intermediate plate portion 117 is shielded by the magnetic plate 119. Because of this, there is no interference between a magnetic field caused by the arc generated between the contact portions 118a of the fixed contacts 111 and 112 and the contact portions 130a of the movable contact 130 and the magnetic field caused by the current flowing through the intermediate plate portion 117, and it is thus possible to prevent the arc from being affected by the magnetic field generated by the current flowing through the intermediate plate portion 117.

At this time, as the opposing magnetic pole faces of the arc extinguishing permanent magnets 143 and 144 are N-poles, and the outer sides thereof are S-poles, magnetic flux emanating from the N-poles, seen in plan view as shown in FIG. 6(a), crosses an arc generation portion of a portion in which the contact portion 118a of the fixed contact 111 and the contact portion 130a of the movable contact 130 are opposed, from the inner side to the outer side in the longitudinal direction of the movable contact 130, and reaches the S-pole, whereby a magnetic field is formed. In the same way, the magnetic flux crosses an arc generation portion of the contact portion 118a of the fixed contact 112 and the contact portion 130a of the movable contact 130, from the inner side to the outer side in the longitudinal direction of the movable contact 130, and reaches the S-pole, whereby a magnetic field is formed.

Consequently, the magnetic fluxes of the arc extinguishing magnets 143 and 144 both cross between the contact portion 118a of the fixed contact 111 and the contact portion 130a of the movable contact 130 and between the contact portion 118a of the fixed contact 112 and the contact portion 130a of the movable contact 130, in mutually opposite directions in the longitudinal direction of the movable contact 130.

Figure 6C:
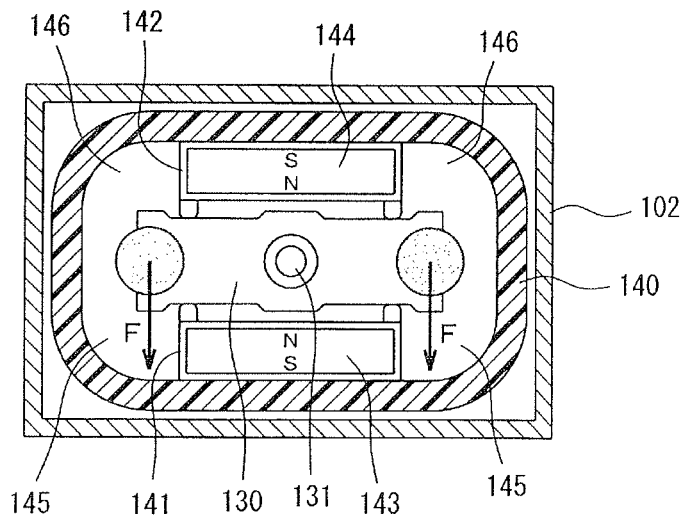

Because of this, a current I flows from the fixed contact 111 side to the movable contact 130 side between the contact portion 118a of the fixed contact 111 and the contact portion 130a of the movable contact 130, and the orientation of the magnetic flux $\phi$ is in a direction from the inner side toward the outer side, as shown in FIG. 6(b). Because of this, in accordance with Fleming's left-hand rule, a large Lorentz force F acts toward the arc extinguishing space 145 side, perpendicular to the longitudinal direction of the movable contact 130 and perpendicular to the switching direction of the contact portion 118a of the fixed contact 111 and the movable contact 130, as shown in FIG. 6(c).

Due to the Lorentz force F, an arc generated between the contact portion 118a of the fixed contact 111 and the contact portion 130a of the movable contact 130 is greatly extended so as to pass from the side surface of the contact portion 118a of the fixed contact 111 through the inside of the arc extinguishing space 145, reaching the upper surface side of the movable contact 130, and is extinguished.

Also, at the lower side and upper side of the arc extinguishing space 145, magnetic flux inclines to the lower side and upper side with respect to the orientation of the magnetic flux between the contact portion 118a of the fixed contact 111 and the contact portion 130a of the movable contact 130. Because of this, the arc extended to the arc extinguishing space 145 is further extended by the inclined magnetic flux in the direction of the corner of the arc extinguishing space 145, it is possible to increase the arc length, and thus possible to obtain good interruption performance.

Meanwhile, the current I flows from the movable contact 130 side to the fixed contact 112 side between the contact portion 118a of the fixed contact 112 and the movable contact 130, and the orientation of the magnetic flux φ is in a rightward direction from the inner side toward the outer side, as shown in FIG. 6(*b*). Because of this, in accordance with Fleming's left-hand rule, a large Lorentz force F acts toward the arc extinguishing space 145, perpendicular to the longitudinal direction of the movable contact 130 and perpendicular to the switching direction of the contact portion 118a of the fixed contact 112 and the movable contact 130.

Due to the Lorentz force F, an arc generated between the contact portion 118a of the fixed contact 112 and the movable contact 130 is greatly extended so as to pass from the upper surface side of the movable contact 130 through the inside of the arc extinguishing space 145, reaching the side surface side of the fixed contact 112, and is extinguished.

Also, at the lower side and upper side of the arc extinguishing space 145, as heretofore described, magnetic flux inclines to the lower side and upper side with respect to the orientation of the magnetic flux between the contact portion 118a of the fixed contact 112 and the contact portion 130a of the movable contact 130. Because of this, the arc extended to the arc extinguishing space 145 is further extended by the inclined magnetic flux in the direction of the corner of the arc extinguishing space 145, it is possible to increase the arc length, and thus possible to obtain good interruption performance.

Meanwhile, in the engaged condition of the electromagnetic contactor 10, when adopting a released condition in a condition wherein a regenerative current flows from the load side to the direct current power source side, the direction of current in FIG. 6(*b*) is reversed, meaning that the Lorentz force F acts on the arc extinguishing space 146 side, and apart from the arc extending to the arc extinguishing space 146 side, the same arc extinguishing function is fulfilled.

At this time, as the arc extinguishing permanent magnets 143 and 144 are disposed in the magnet housing pockets 141 and 142 formed in the insulating cylinder 140, the arc does not directly contact with the arc extinguishing permanent magnets 143 and 144. Because of this, it is possible to stably maintain the magnetic characteristics of the arc extinguishing permanent magnets 143 and 144, and thus possible to stabilize interruption performance.

Also, as it is possible to cover and insulate the inner peripheral surface of the metal square tubular body 104 with the insulating cylinder 140, there is no short circuiting of the arc when the current is interrupted, and it is thus possible to reliably carry out current interruption.

Furthermore, as it is possible to carry out the insulating function, the function of positioning the arc extinguishing permanent magnets 143 and 144, and the function of protecting the arc extinguishing permanent magnets 143 and 144 from the arc with the one insulating cylinder 140, it is possible to reduce manufacturing cost.

Also, as the movable contact guide members 148 and 149 that slide against a side edge of the movable contact are formed protruding on the permanent magnet housing pockets 141 and 142 housing the arc extinguishing permanent magnets 143 and 144 in positions facing the movable contact 130, it is possible to reliably prevent turning of the movable contact 130.

In this way, according to the embodiment, as the C-shaped portions 115 of the fixed contacts 111 and 112 and the contact spring 134 that provides contact pressure to the movable contact 130 are disposed in parallel in the contact device 100, it is possible to reduce the height of the contact mechanism 101 in comparison with a case wherein the fixed contacts, movable contact, and contact spring are disposed in series, as described in PLT 1. Because of this, it is possible to reduce the size of the contact device 100.

Also, as the arc extinguishing chamber 102 is formed by brazing the square tubular body 104 and the plate-like fixed contact support insulating substrate 105, which closes off the upper plane of the square tubular body 104 and in which the fixed contacts 111 and 112 are held and fixed by brazing, it is possible to arrange fixed contact support insulating substrates 105 closely together, on the same plane, vertically and horizontally, possible to carry out a metalizing process on a plurality of fixed contact support insulating substrates 105 at one time, and thus possible to improve productivity.

Also, as it is possible to braze the fixed contact support insulating substrate 105 to the square tubular body 104 after brazing and supporting the fixed contacts 111 and 112 to the fixed contact support insulating substrate 105, it is possible to easily carry out the fixing and holding of the fixed contacts 111 and 112, a simple configuration is sufficient for the brazing jig, and it is thus possible to achieve a reduction in the cost of the assembly jig.

Control and management of the flatness and warpage of the fixed contact support insulating substrate 105 are also easier in comparison with a case wherein the arc extinguishing chamber 102 is formed in a tub-form. Furthermore, it is possible to fabricate a large number of the arc extinguishing chambers 102 at one time, and thus possible to reduce the cost of fabrication.

Also, with regard to the electromagnet unit 200, as the ring-form permanent magnet 220 magnetized in the movable direction of the movable plunger 215 is disposed on the upper magnetic yoke 210, and the auxiliary yoke 225 is formed on the upper surface of the ring-form permanent magnet 220, it is possible to generate attracting force to attract the peripheral flange portion 216 of the movable plunger 215 with the one ring-form permanent magnet 220.

Because of this, it is possible to carry out the fixing of the movable plunger 215 in the released condition with the magnetic force of the ring-form permanent magnet 220 and the urging force of the return spring 214, meaning that it is possible to improve holding force with respect to malfunction shock.

Also, it is possible to reduce the urging force of the return spring 214, and thus possible to reduce the total load of the contact spring 134 and return spring 214. Consequently, it is possible to reduce the attracting force generated by the exciting coil 208 in accordance with the amount by which the total load is reduced, and thus possible to reduce the magnetomotive force of the exciting coil 208. Because of this, it is possible to reduce the shaft direction length of the spool 204, and thus possible to reduce the movable direction height of the movable plunger 215 of the electromagnet unit 200.

In this way, as it is possible to reduce the movable direction height of the movable plunger 215 in both the contact device 100 and electromagnet unit 200, it is possible to considerably shorten the overall configuration of the electromagnetic contactor 10 in comparison with that of the heretofore known example described in PLT 1, and thus possible to achieve a reduction in size.

Furthermore, by disposing the peripheral flange portion 216 of the movable plunger 215 inside the inner peripheral surface of the ring-form permanent magnet 220, there is no waste in the closed circuit passing magnetic flux generated by the ring-form permanent magnet 220, leakage flux decreases, and it is possible to use the magnetic force of the permanent magnet effectively.

Also, as the peripheral flange portion 216 of the movable plunger 215 is disposed between the upper magnetic yoke 210 and the auxiliary yoke 225 formed on the upper surface of the ring-form permanent magnet 220, it is possible to regulate the stroke of the movable plunger 215 with the thickness of the ring-form permanent magnet 220 and the thickness of the peripheral flange portion 216 of the movable plunger 215.

Because of this, it is possible to reduce to a minimum the cumulative number of parts and form tolerance, which affect the stroke of the movable plunger 215. Moreover, by carrying out the regulation of the stroke of the movable plunger 215 using only the thickness of the ring-form permanent magnet 220 and the thickness of the peripheral flange portion 216 of the movable plunger 215, it is possible to minimize variation of the stroke.

Next, a description will be given, based on FIG. 10, of a second embodiment of the invention.

In the second embodiment, the configuration of the arc extinguishing chamber is changed.

Figure 10:
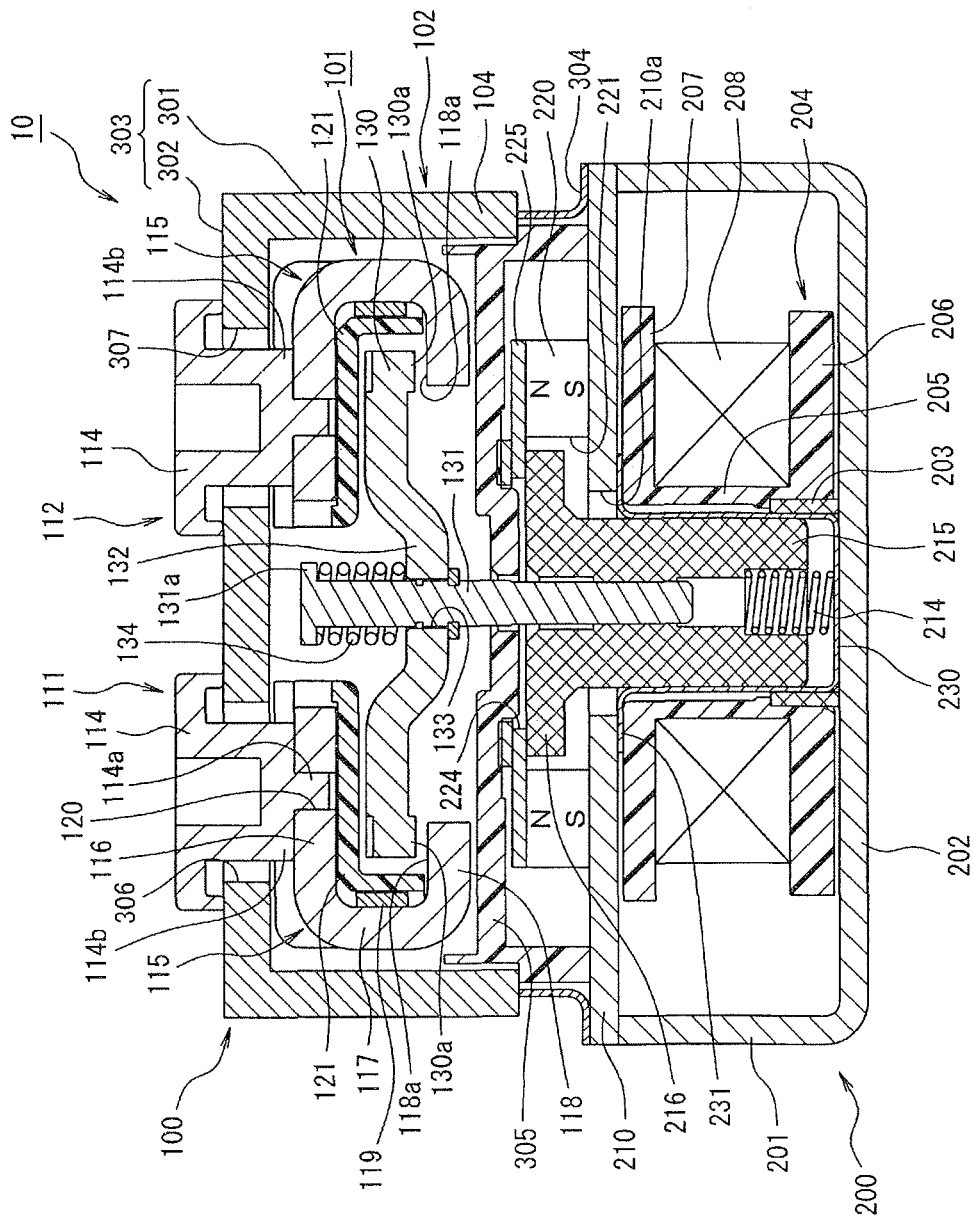
FIG. 10 is a sectional view showing a second embodiment of an electromagnetic contactor according to the invention.

That is, in the second embodiment, as shown in FIG. 10 and FIG. 2(b), a square tubular portion 301 and an upper surface plate portion 302 closing off the upper end of the square tubular portion 301 are formed integrally of a ceramic or a synthetic resin material, forming a tub-form body 303, a metal foil is formed on an open end surface side of the tub-form body 303 by a metalizing process, and a metal connection member 304 is seal joined to the metal foil, configuring the arc extinguishing chamber 102.

Further, a bottom plate portion 305, corresponding to the bottom plate portion 104b in the first embodiment, formed of, for example, a synthetic resin is disposed on the inner peripheral surface on the bottom surface side of the tub-form body 303.

Also, through holes 306 and 307 into which the fixed contacts 111 and 112 are inserted are formed in the upper surface plate portion 302, in the same way as in the fixed contact support insulating substrate 105, and the fixed contacts 111 and 112 are supported in the through holes 306 and 307, in the same way as in the first embodiment.

Other configurations have the same configuration as in the first embodiment, portions corresponding to those in FIG. 1 are given the same reference signs, and a detailed description thereof is omitted.

According to the second embodiment, as the arc extinguishing chamber 102 is configured of the tub-form body 303 integrally formed of an insulating material, it is possible to easily form the air tight arc extinguishing chamber 102 in a small number of man hours, and it is possible to reduce the number of parts.

Figure 11A:
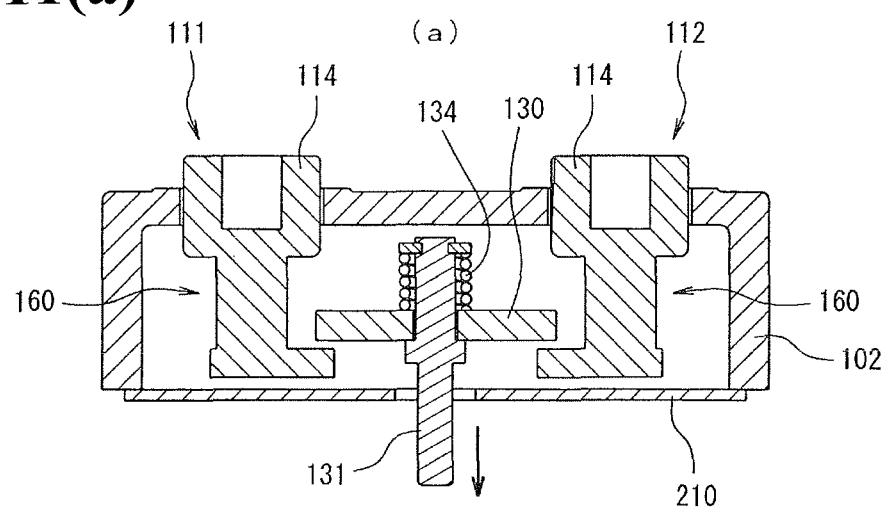
Figure 11B:
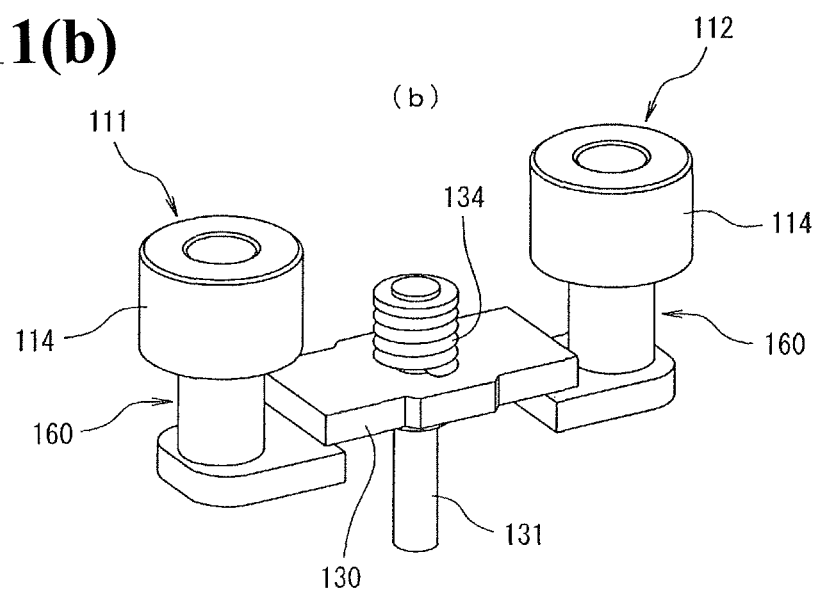

In the first and second embodiments, a description has been given of a case wherein the C-shaped portion 115 is formed in the fixed contacts 111 and 112 but, not being limited to this, an L-shaped portion 160, of a form such that the upper plate portion 116 of the C-shaped portion 115 is omitted, may be connected to the support conductor portion 114, as shown in FIGS. 11(a), 11(b).

In this case too, in the closed contact condition wherein the movable contact 130 contacts with the fixed contacts 111 and 112, it is possible to cause magnetic flux generated by the current flowing through a vertical plate portion of the L-shaped portion 160 to act on portions in which the fixed contacts 111 and 112 and the movable contact 130 are in contact. Because of this, it is possible to increase the magnetic flux density in the portions in which the fixed contacts 111 and 112 and the movable contact 130 are in contact, generating a Lorentz force that opposes the electromagnetic repulsion force.

Figure 12A:
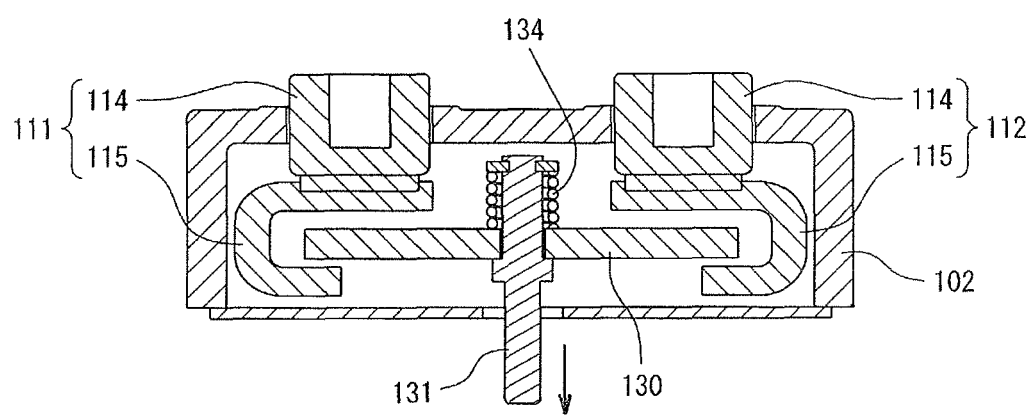
Figure 12B:
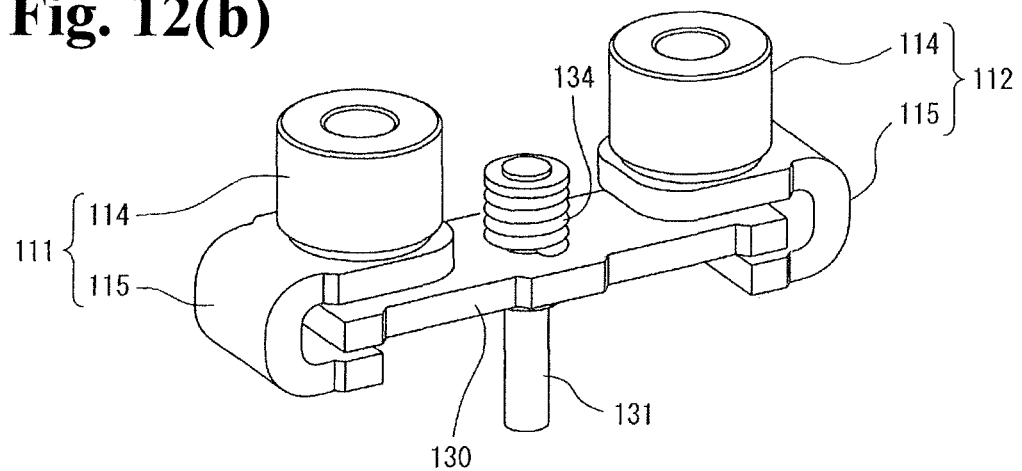

Also, in the first and second embodiments, a description has been given of a case wherein the movable contact 130 has a depressed portion 132 in a central portion thereof but, not being limited to this, the depressed portion 132 may be omitted, forming a flat plate, as shown in FIGS. 12(a), 12(b).

Also, in the first and second embodiments, a description has been given of a case wherein the insulating cylinder 140 that holds the arc extinguishing permanent magnets 143 and 144 is integrally formed, but not being limited to this.

Figure 13:
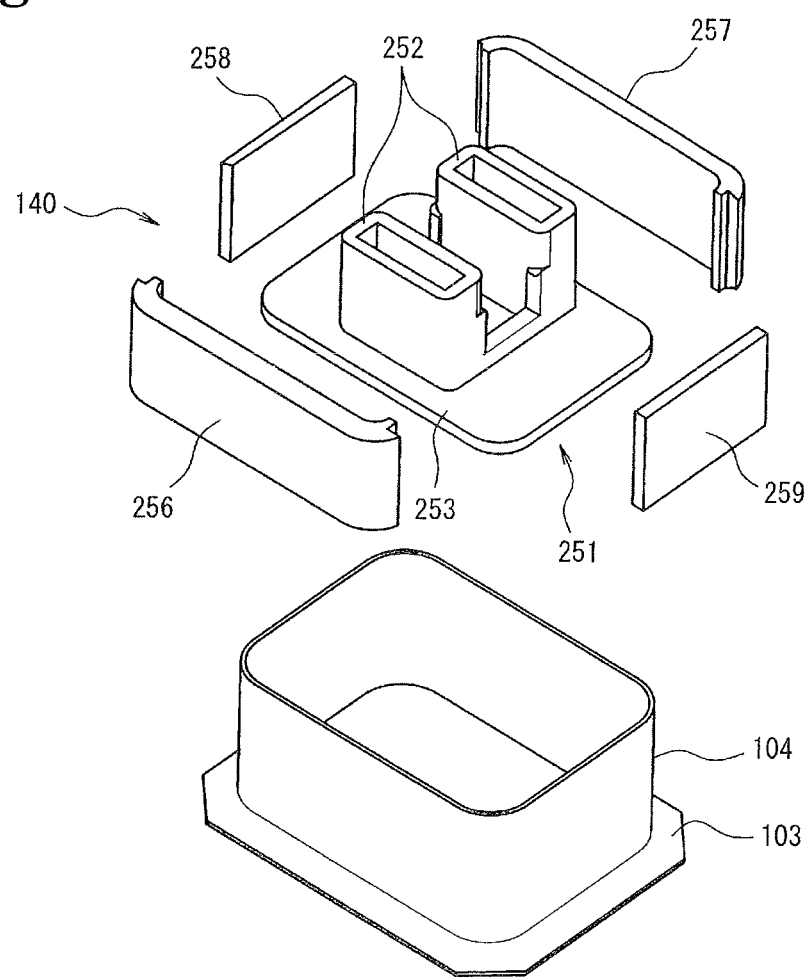
FIG. 13 is an exploded perspective view showing a modification example of an insulating tubular body of the contact device.

That is, as shown in FIG. 13, the insulating cylinder 140 may be formed by disposing an assembly of four side plate portions 256 to 259 configuring side walls on front and back and left and right end portions of a bottom plate portion 253 on which is formed a magnet housing portion 252 of a base member 251, and connecting the side plate portions 256 to 259. In this case, as the side wall portion is divided into the four side-plate portions 256 to 259, manufacture is easier compared with the case in which the whole is formed integrally. Furthermore, a square tubular body wherein the four side plate portions 256 to 259 are integrated may also be formed.

Also, in the first and second embodiments, a description has been given of a case wherein the connecting shaft 131 is screwed to the movable plunger 215, but the movable plunger 215 and connecting shaft 131 may also be formed integrally. Also, a description has been given of a case wherein the connection of the connecting shaft 131 and movable contact 130 is such that the flange portion 131a is formed on the leading end portion of the connecting shaft 131, and the lower end of the movable contact 130 is fixed with a C-ring after the connecting shaft 131 is inserted into the contact spring 134 and movable contact 130, but not being limited to this. That is, a positioning large diameter portion may be formed protruding in a radial direction in the C-ring position of the connecting shaft 131, the contact spring 134 may be disposed after the movable contact 130 contacts with the large diameter portion, and the upper end of the contact spring 134 may be fixed with the C-ring.

Figure 14A:
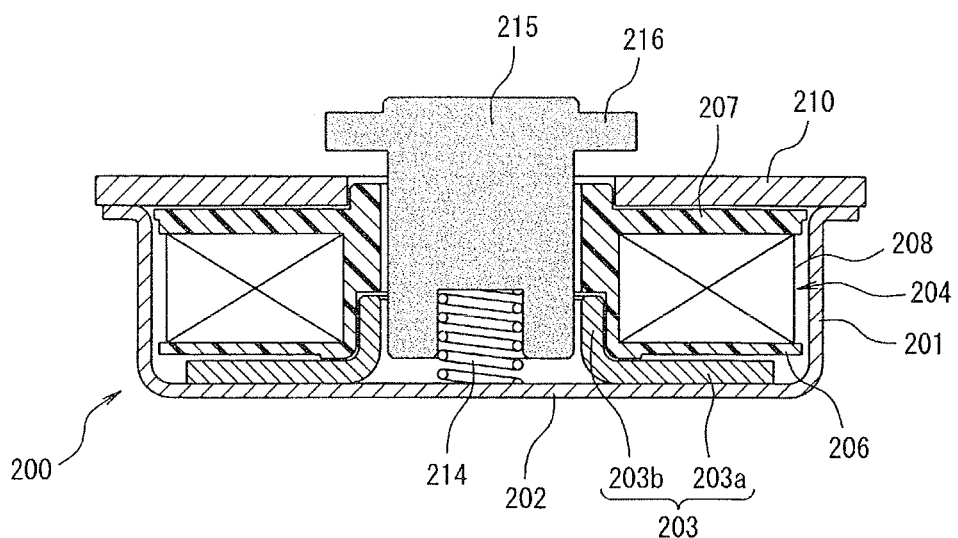
Figure 14B:
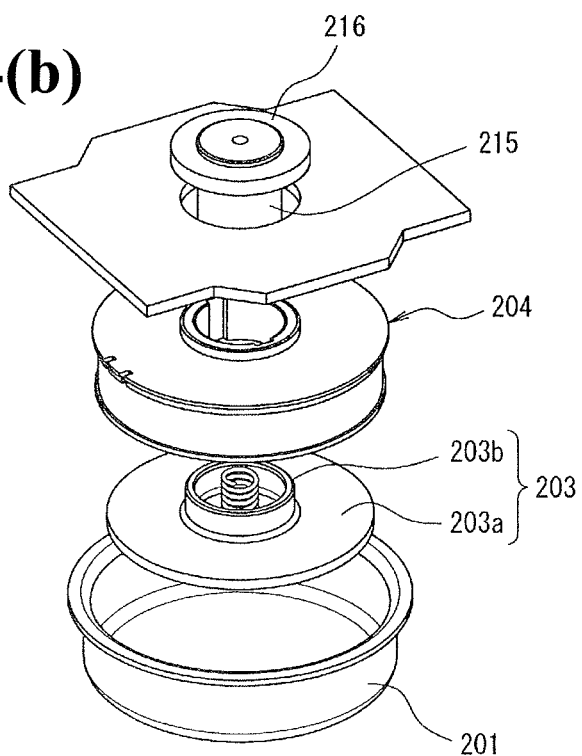

Also, in the first and second embodiments, a description has been given of a case wherein the cylindrical auxiliary yoke 203 is disposed in proximity to the lower end side of the movable plunger 215, but not being limited to this. That is, as shown in FIGS. 14(a), 14(b), the magnetic yoke 201 may be formed in a bottomed cylindrical form, and the auxiliary yoke 203 may be configured of an annular plate portion 203a along the bottom plate portion 202 of the magnetic yoke 201 and a cylinder portion 203b rising upward from the inner peripheral surface of the annular plate portion 203a.

Figure 15A:
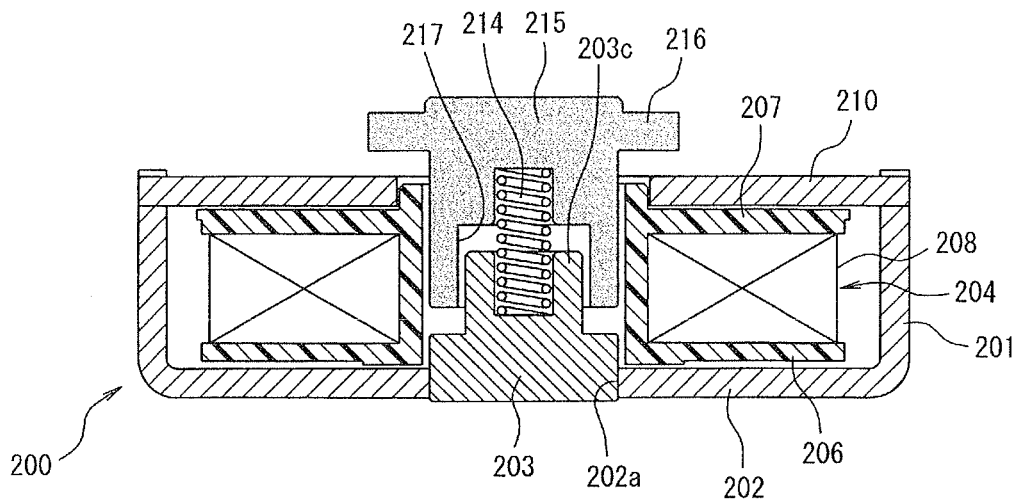
Figure 15B:
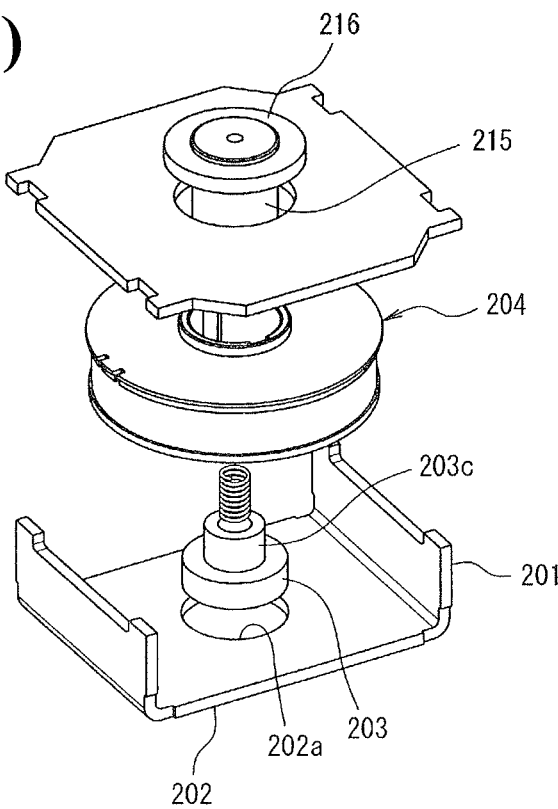

Also, as shown in FIGS. 15(a), 15(b), a through hole 202a may be formed in the bottom plate portion 202 of the U-shaped magnetic yoke 201, the protruding form of the auxiliary yoke 203 may be fitted inside the through hole 202a, and a small diameter portion 203c of the auxiliary yoke 203 may be inserted into an insertion hole 217 formed in the movable plunger 215.

Also, in the embodiments, a description has been given of a case wherein a hermetic receptacle is configured of the arc extinguishing chamber 102 and cap 230, and gas is encapsulated inside the hermetic receptacle but, not being limited to this, the gas encapsulation may be omitted when the interrupted current is small.

What is claimed is:

1. An electromagnetic contactor, comprising:
a contact device having a pair of fixed contacts spaced at a predetermined interval with L-shaped portions extending at a predetermined length in a mutually facing direction and contact portions, and a movable contact having two ends disposed to be capable of contacting to and separating from the contact portions;
an electromagnet unit including a magnetic yoke, an exciting coil disposed in the magnetic yoke, a movable plunger having a main portion disposed inside the exiting coil and a peripheral flange portion protruding outwardly from one end portion of the main portion above the exiting coil, a return spring disposed under the main portion to urge the movable plunger upwardly, and a ring-form permanent magnet disposed on the magnetic yoke and having a through hole to enclose the peripheral flange portion therein, the peripheral flange portion having a predetermined thickness in a movable direction of the movable plunger thinner than that of the ring-form permanent magnet to move in the through hole of the ring-form permanent magnet in the movable direction of the movable plunger;
a connecting shaft connecting the movable contact of the contact device and the movable plunger; and
a contact spring disposed on one end portion of the connecting shaft above the movable contact between the pair of fixed contacts to urge the movable contact downwardly,
wherein
the ring-form permanent magnet is magnetized in the movable direction of the movable plunger to assist movement of the movable plunger.

2. The electromagnetic contactor according to claim 1, wherein the pair of fixed contacts further comprises opposing plate portions to form C-shaped portions sandwiching the two ends of the movable contact therein, and insulating covers regulating arc generation and mounted on inner peripheral portions of the C-shaped portions other than the contact portions, respectively.

3. The electromagnetic contactor according to claim 1, wherein the contact device further comprises a contact housing case housing the pair of fixed contacts and the movable contact, and an arc extinguishing permanent magnet arranged along the movable contact on an inner peripheral surface side of the contact housing case.

4. The electromagnetic contactor according to claim 3, wherein the contact housing case comprises:
a metal tubular body having an open end surface and one end hermetically sealed to an upper portion of the magnetic yoke of the electromagnet unit, and enclosing the pair of fixed contacts and the movable contact,
a fixed contact support insulating substrate joined hermetically to close the open end surface of the metal tubular body and supporting the pair of fixed contacts, and
an insulating tubular body disposed on an inner peripheral surface of the metal tubular body.

5. The electromagnetic contactor according to claim 1, wherein the connecting shaft includes a flange portion formed on the one end portion thereof; a central portion of the movable contact includes a depressed portion protruding toward an electromagnet unit side and supported on the connecting shaft; and the contact spring is arranged between the flange portion of the connecting shaft and the depressed portion of the movable contact.

6. The electromagnetic contactor according to claim 1, wherein the electromagnet unit comprises:
the magnetic yoke including a U-shaped magnetic yoke having a cross-section of a U-shape in which an upper portion is open, and an upper magnetic yoke having an aperture and covering the upper portion of the U-shaped magnetic yoke,
a spool having a central aperture and wound with the exciting coil disposed on a bottom surface plate portion of the U-shaped magnetic yoke,
the movable plunger movably disposed in an axial direction in the central aperture of the spool, and the main portion passing through the aperture formed in the upper magnetic yoke and urged by the return spring,
the ring-form permanent magnet fixed on the upper magnetic yoke to enclose the peripheral flange portion formed on the main portion, and magnetized in the axial direction, and
an auxiliary yoke fixed on an upper surface of the ring-form permanent magnet and arranged to be able to contact with the peripheral flange portion of the movable plunger on a side opposite to that of the upper magnetic yoke.

7. The electromagnetic contactor according to claim 6, wherein the magnetic yoke further comprises a ring-form auxiliary yoke enclosing side surfaces of a bottom surface portion of the movable plunger in a released position,
wherein a length of a gap between a side surface of the ring-form auxiliary yoke and the side surface of the movable plunger is set to be less than a length of a gap between the bottom surface portion of the movable plunger and a bottom surface of the U-shaped magnetic yoke.

8. The electromagnetic contactor according to claim 1, wherein the electromagnet unit further comprises an auxiliary yoke disposed above the ring-form permanent magnet and having a through hole with an inner diameter smaller than that of the peripheral flange portion of the movable plunger, and in a released position where an upper surface of the peripheral flange portion contacts the auxiliary yoke, the auxiliary yoke regulates the movement of the movable plunger, and
the magnetic yoke has an aperture in an upper portion thereof with an inner diameter smaller than that of the peripheral flange portion, and in an engaged position where a lower surface of the peripheral flange portion contacts the upper portion of the magnetic yoke, the upper portion of the magnetic yoke regulates the movement of the movable plunger.

* * * * *

UNITED STATES PATENT AND TRADEMARK OFFICE
CERTIFICATE OF CORRECTION

PATENT NO. : 8,823,472 B2  
APPLICATION NO. : 13/885094  
DATED : September 2, 2014  
INVENTOR(S) : Kouetsu Takaya et al.

Page 1 of 1

It is certified that error appears in the above-identified patent and that said Letters Patent is hereby corrected as shown below:

In the Specification

Change column 1, line 6, from "... Application No. PCT/JP2012/0023330..." to -- Application No. PCT/JP2012/002330 --.

Change column 1, line 47, from "... a few hundred amps flows;..." to -- a few hundred amps flows, --.

Signed and Sealed this  
Thirty-first Day of March, 2015

Michelle K. Lee  
*Director of the United States Patent and Trademark Office*